(12) United States Patent
Gilgen

(10) Patent No.: US 9,171,750 B2
(45) Date of Patent: Oct. 27, 2015

(54) METHODS OF FORMING ELECTRICALLY CONDUCTIVE LINES

(71) Applicant: Micron Technology, Inc., Boise, ID (US)

(72) Inventor: Brent Gilgen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/602,598

(22) Filed: Jan. 22, 2015

(65) Prior Publication Data

US 2015/0132934 A1 May 14, 2015

Related U.S. Application Data

(62) Division of application No. 13/910,280, filed on Jun. 5, 2013, now Pat. No. 8,957,483, which is a division of application No. 12/710,981, filed on Feb. 23, 2010, now Pat. No. 8,470,654.

(51) Int. Cl.
| | |
|---|---|
| *H01L 21/8234* | (2006.01) |
| *H01L 21/74* | (2006.01) |
| *H01L 23/535* | (2006.01) |
| *H01L 23/48* | (2006.01) |
| *H01L 29/78* | (2006.01) |

(52) U.S. Cl.
CPC .............. *H01L 21/743* (2013.01); *H01L 23/48* (2013.01); *H01L 23/535* (2013.01); *H01L 29/78* (2013.01); *H01L 2924/0002* (2013.01)

(58) Field of Classification Search
CPC ..................... H01L 21/823475; H01L 23/495; H01L 23/5382; H01L 31/0508
USPC .................. 438/197; 257/401, 773, E21.575, 257/E21.409, E29.255
See application file for complete search history.

(56) References Cited

U.S. PATENT DOCUMENTS

| | | | |
|---|---|---|---|
| 5,497,017 | A | 3/1996 | Gonzales |
| 6,459,119 | B1 | 10/2002 | Huang et al. |
| 7,203,101 | B2 | 4/2007 | Kajigaya et al. |
| 7,316,952 | B2 | 1/2008 | Lee |
| 7,749,859 | B2 | 7/2010 | Tilke et al. |
| 2005/0054157 | A1 | 3/2005 | Hsu |
| 2007/0045712 | A1 | 3/2007 | Hailer et al. |
| 2009/0273051 | A1 | 11/2009 | Parekh et al. |

*Primary Examiner* — Elias M Ullah
(74) *Attorney, Agent, or Firm* — Wells St. John, P.S.

(57) ABSTRACT

A method of forming an electrically conductive buried line and an electrical contact thereto includes forming of a longitudinally elongated conductive line within a trench in substrate material. A longitudinal end part thereof within the trench is of spoon-like shape having a receptacle. The receptacle is filled with conductive material. Insulative material is formed over the conductive material that is within the receptacle. A contact opening is formed over the conductive material that is within the receptacle. Conductor material is formed in the contact opening in electrical connection with the second conductive material that is within the receptacle. Other method and device implementations are disclosed.

20 Claims, 27 Drawing Sheets

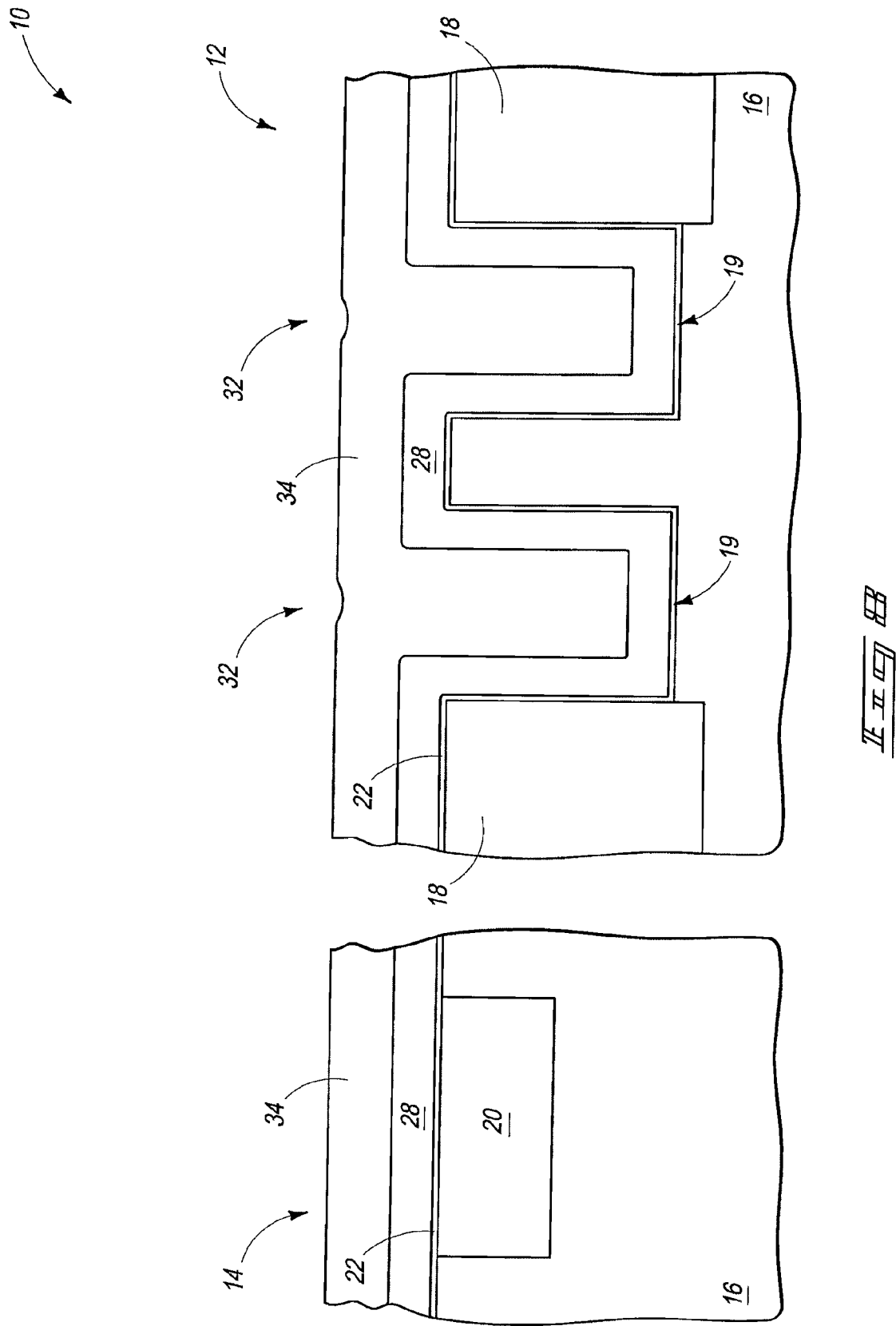

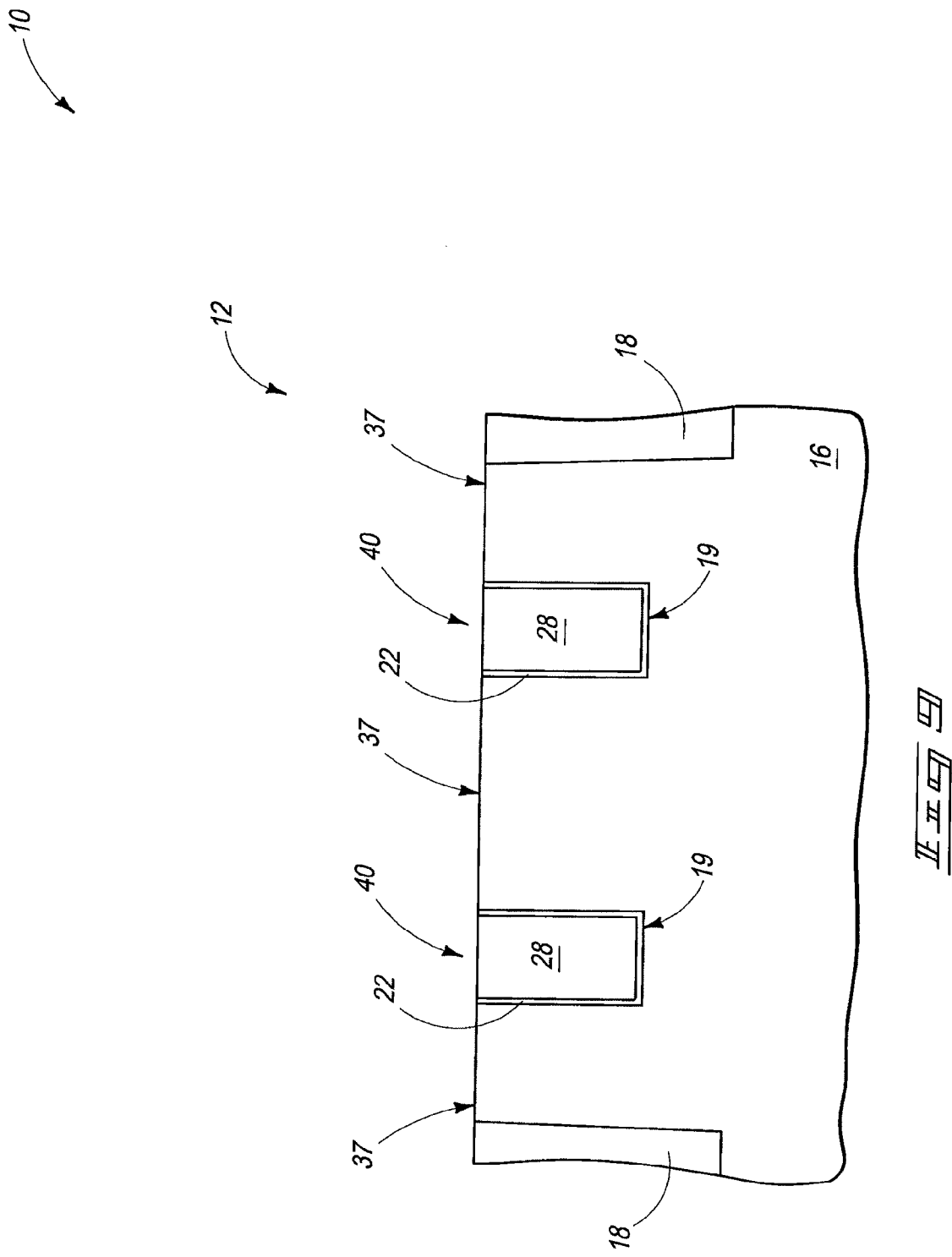

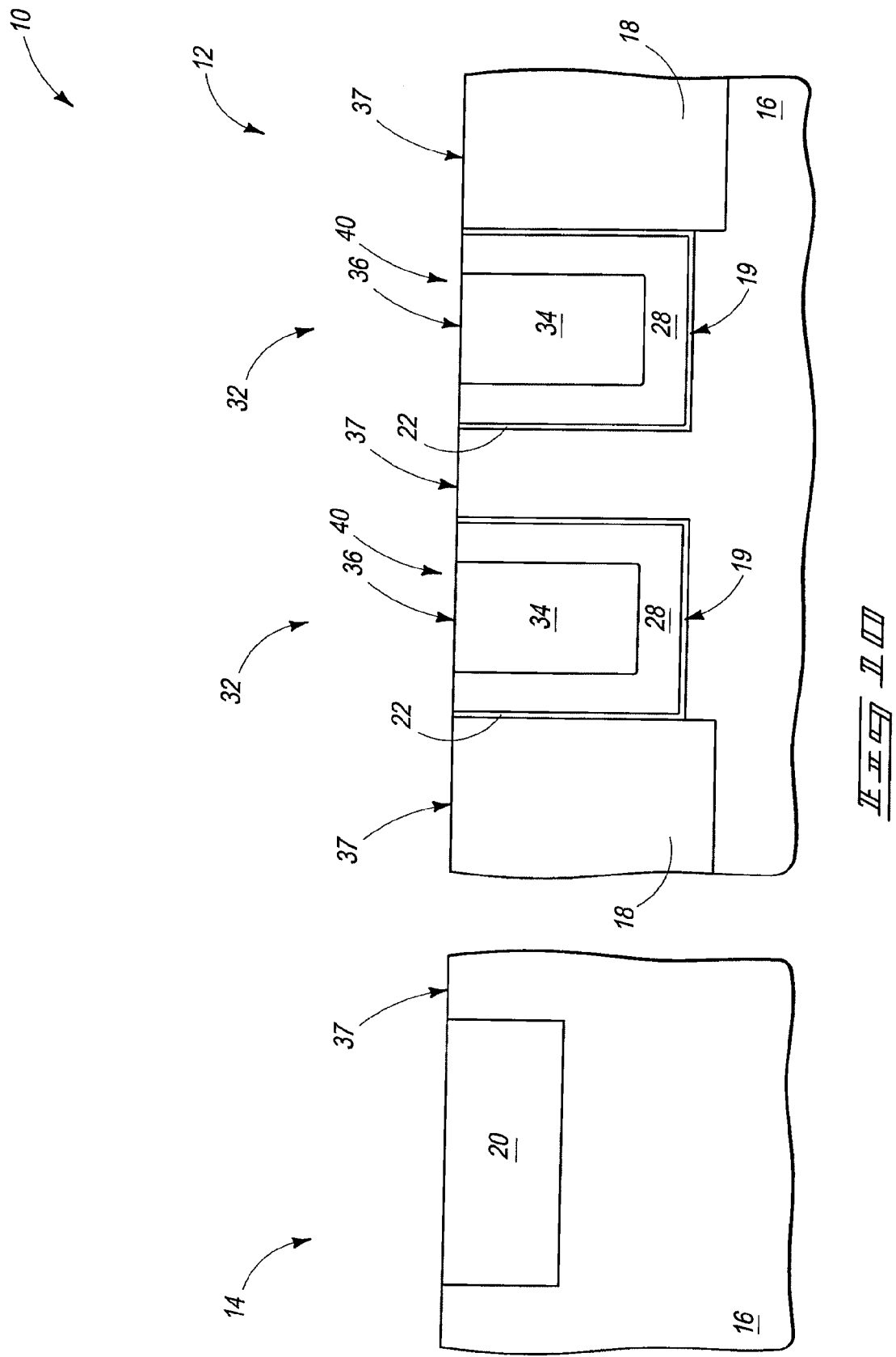

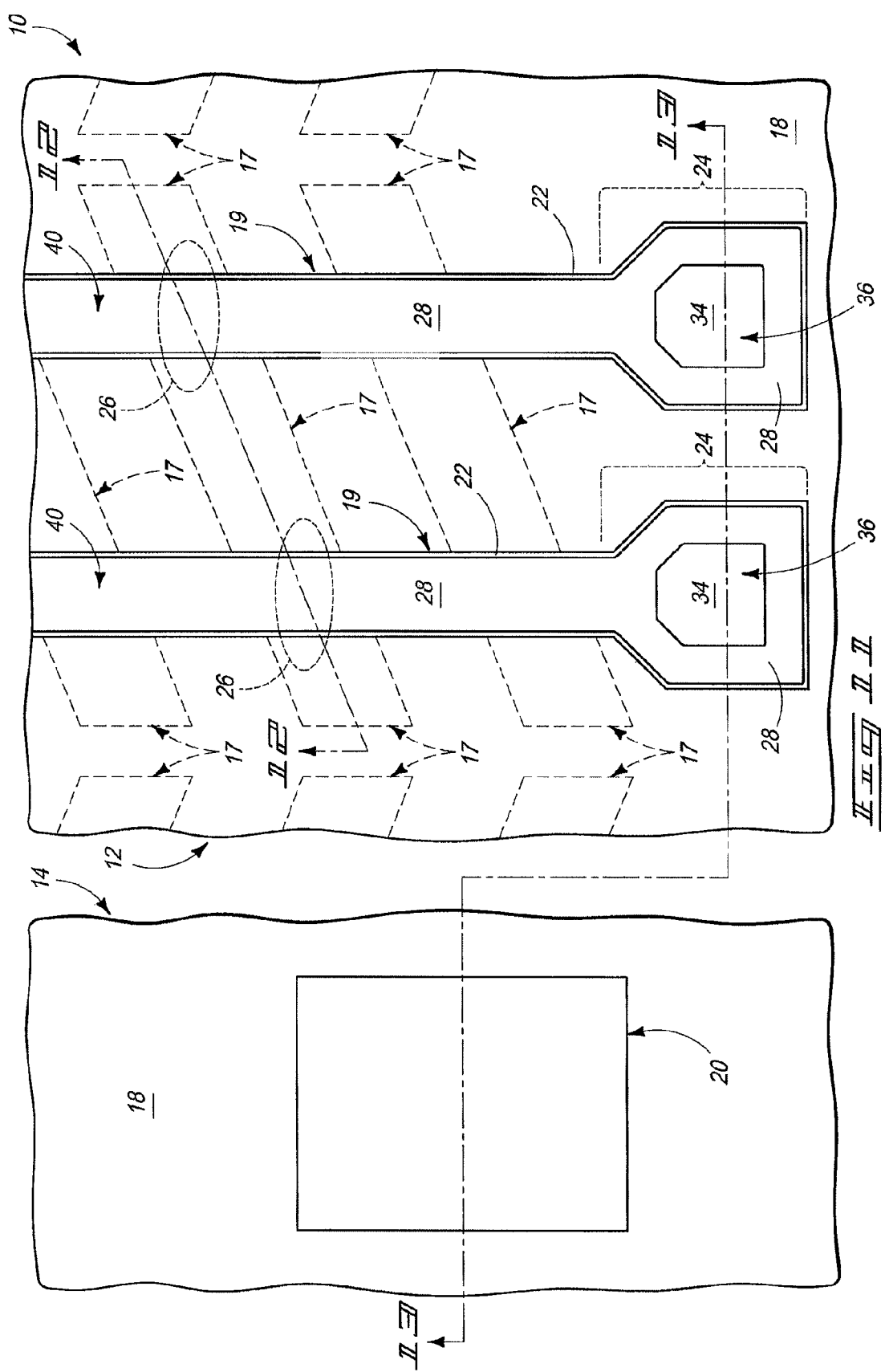

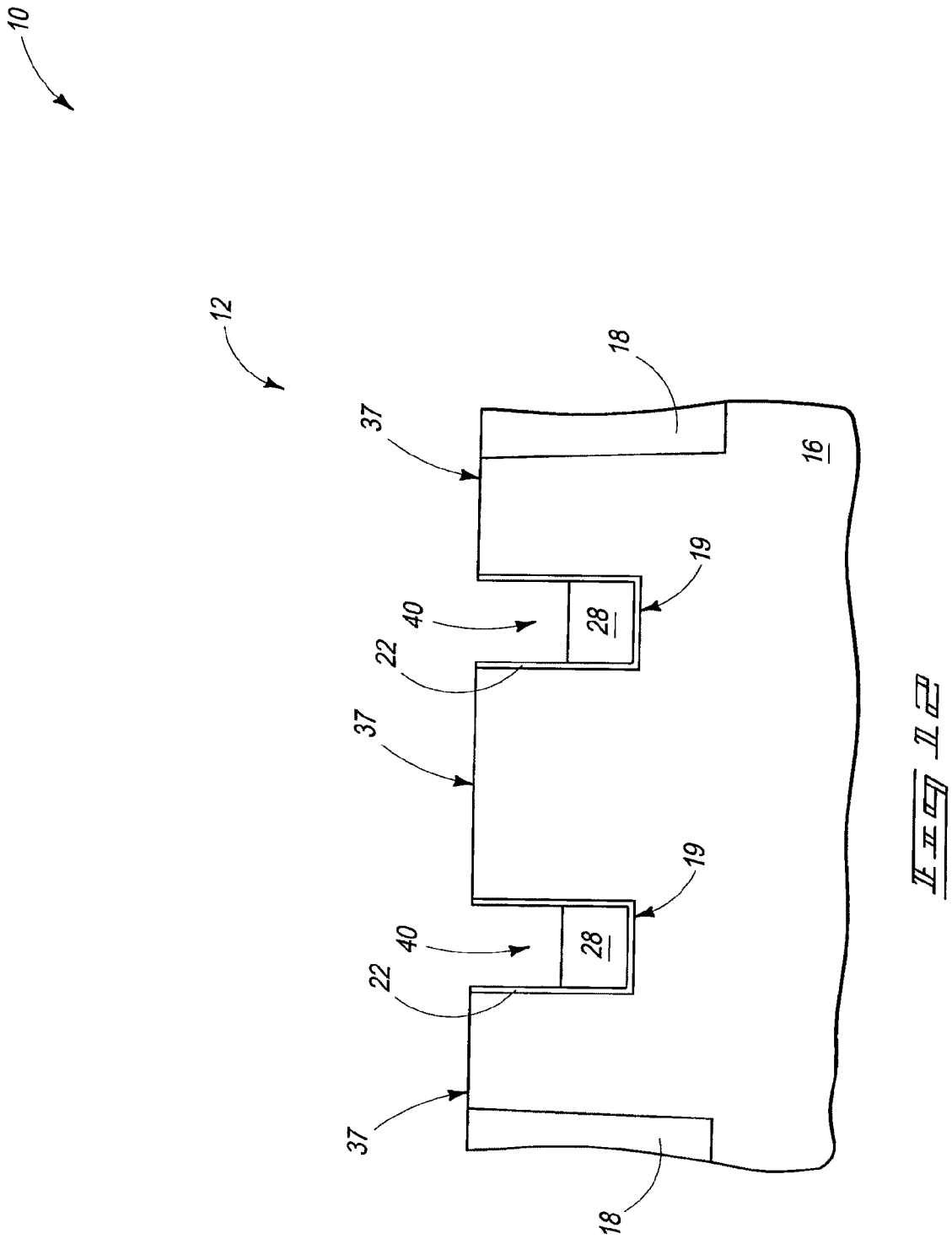

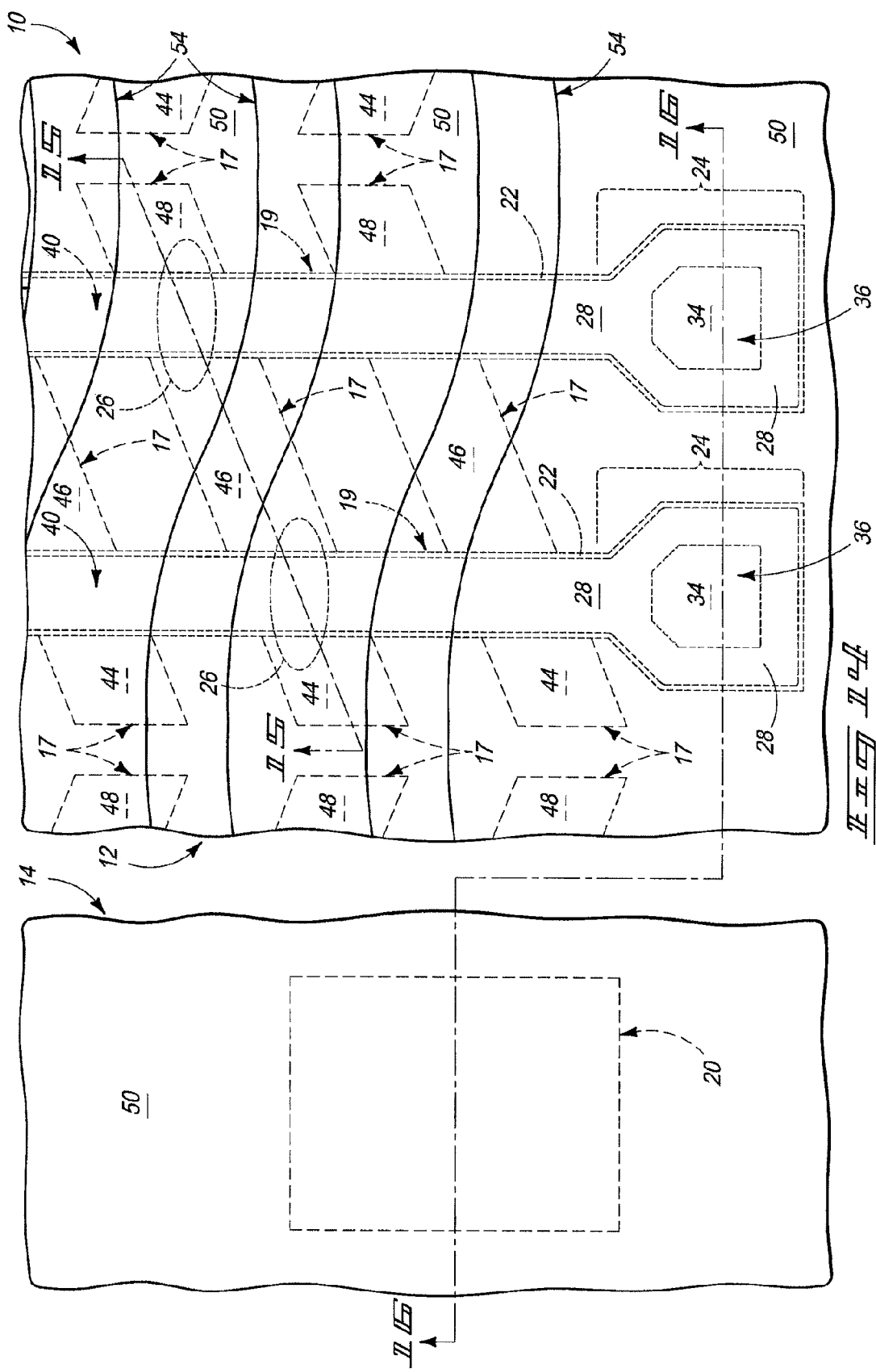

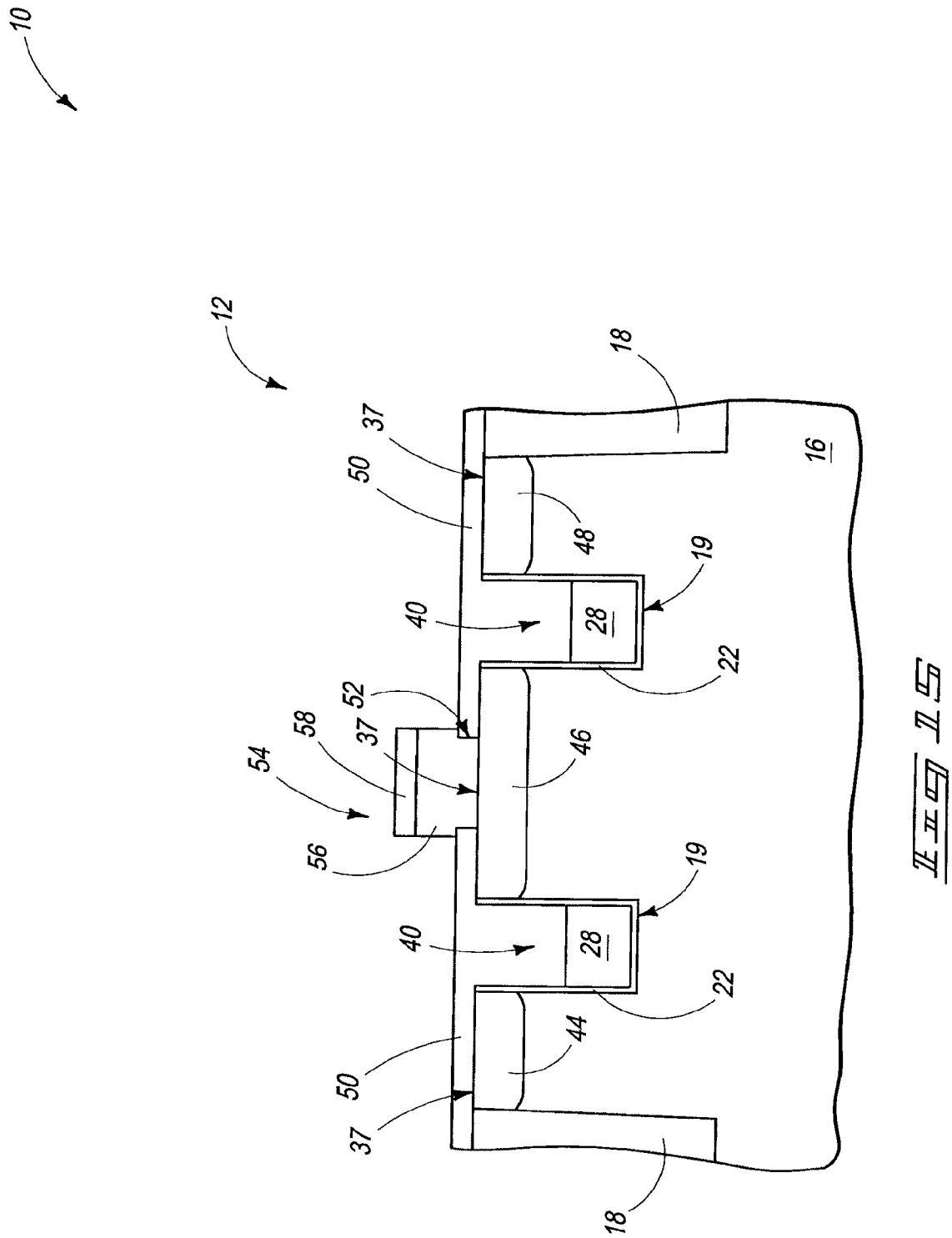

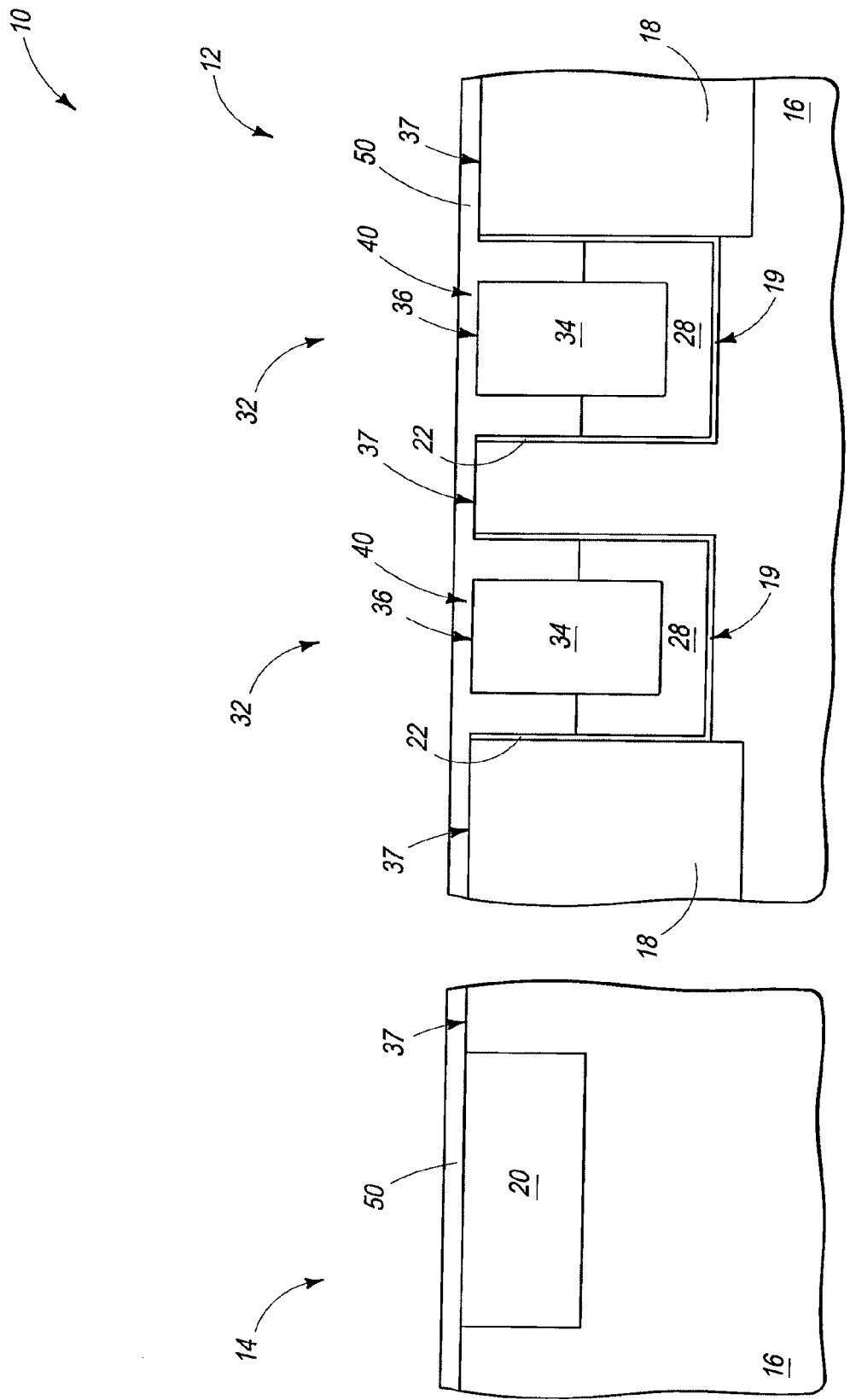

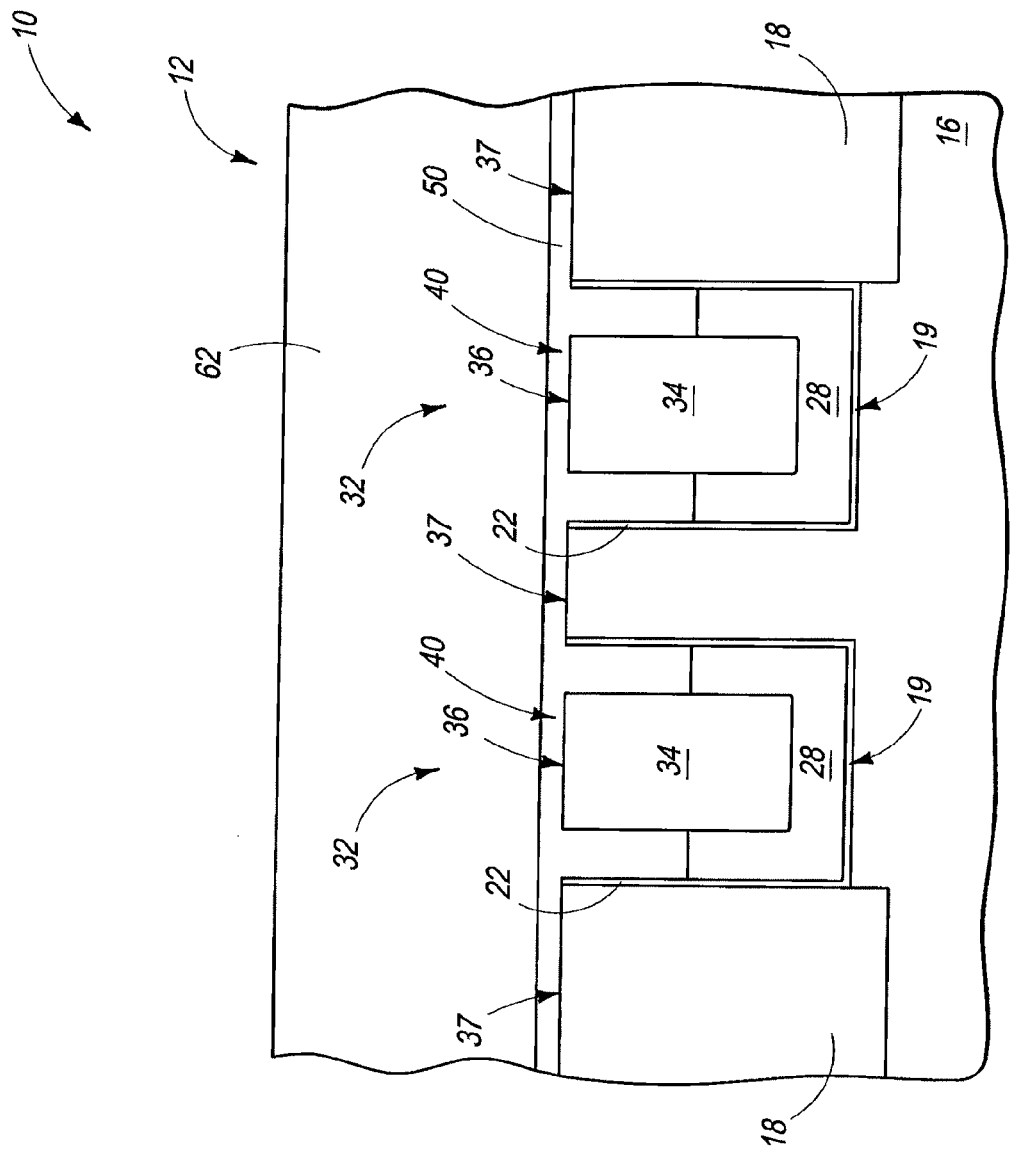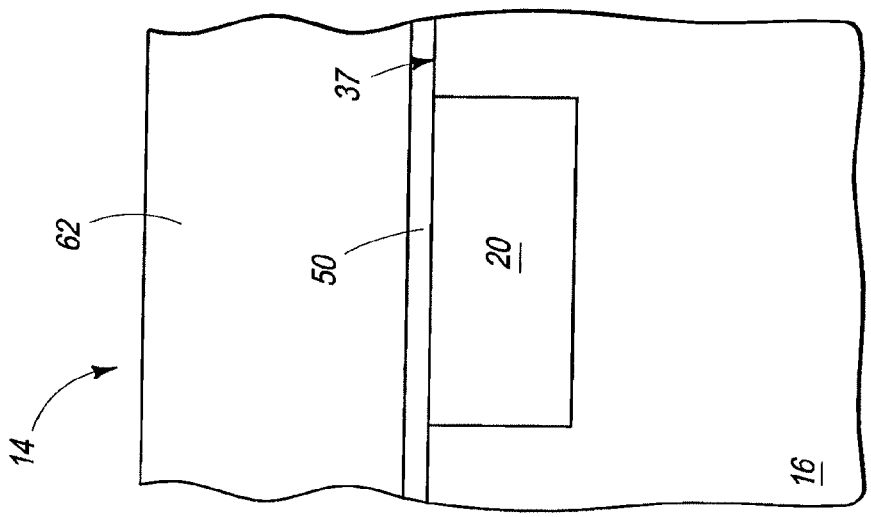
FIG. 18

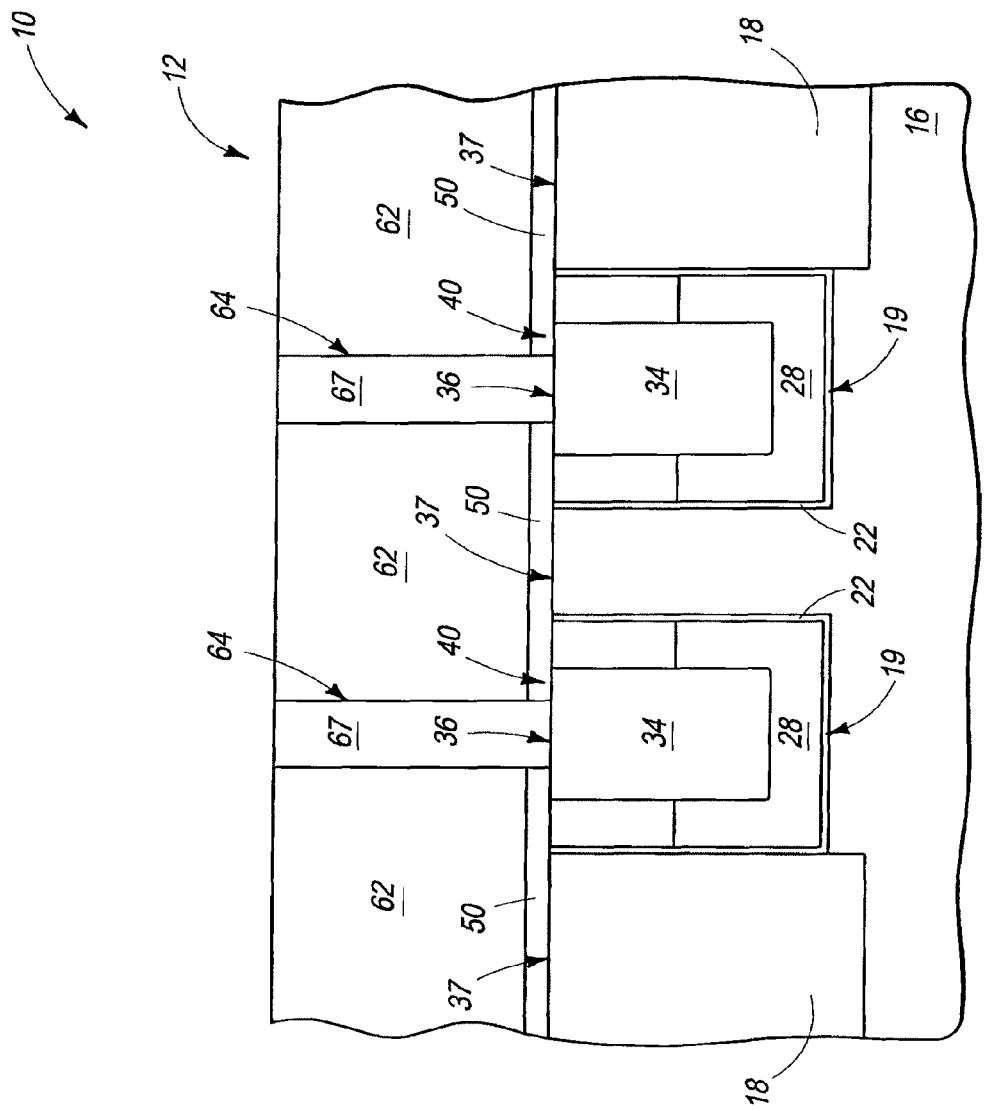
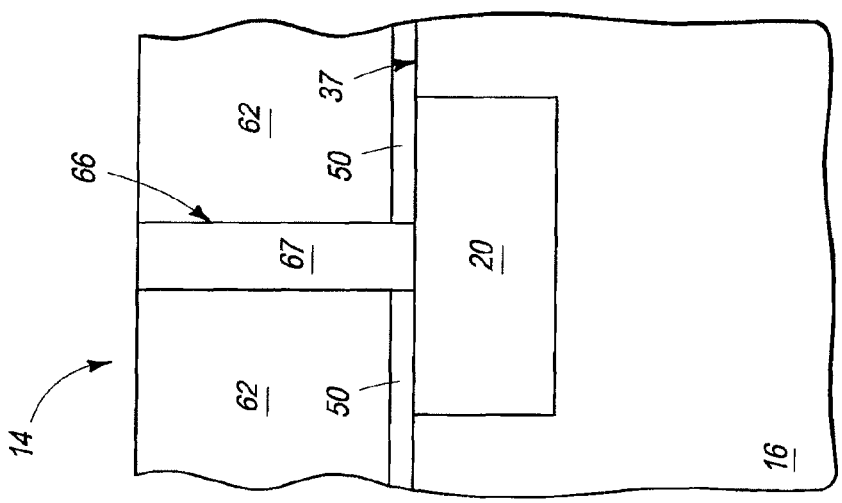
Fig 22

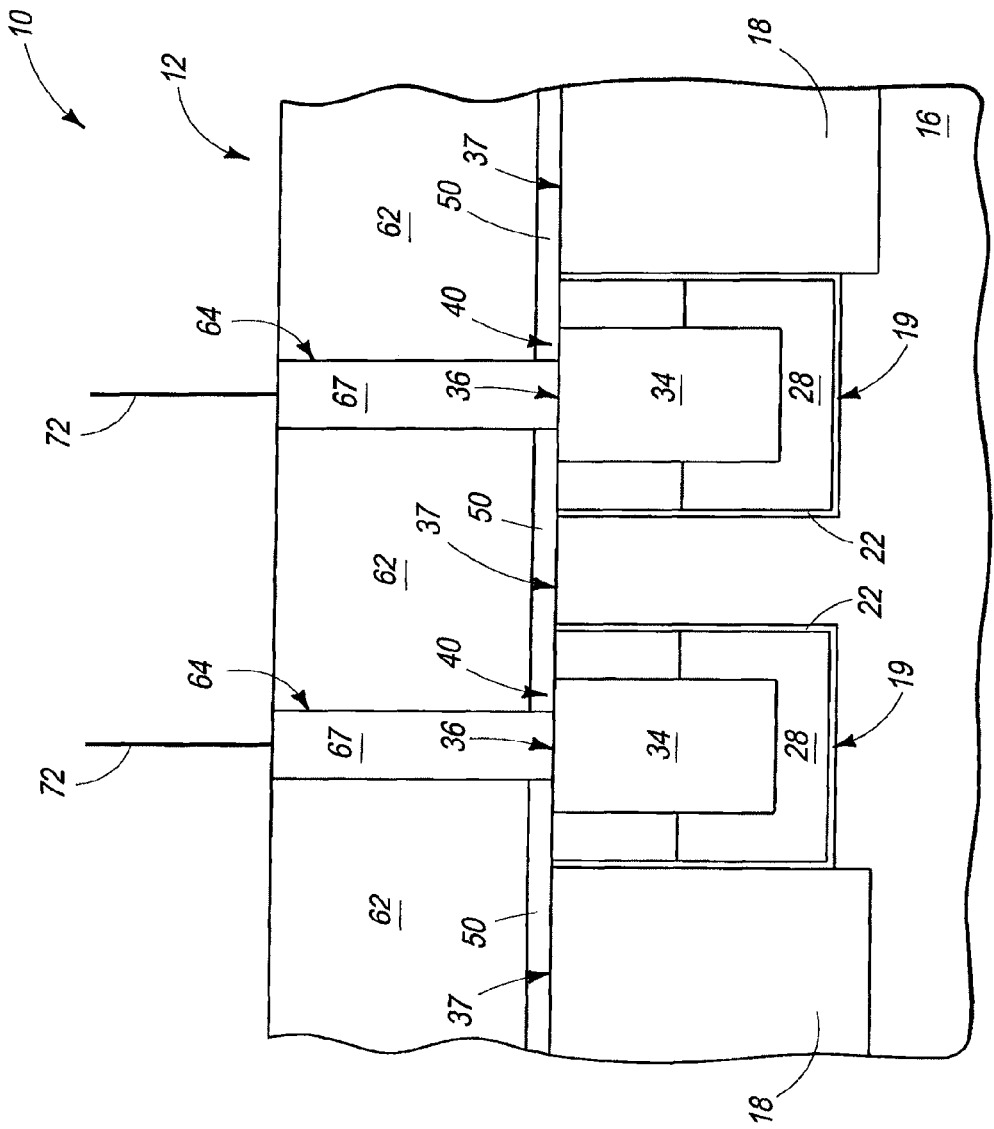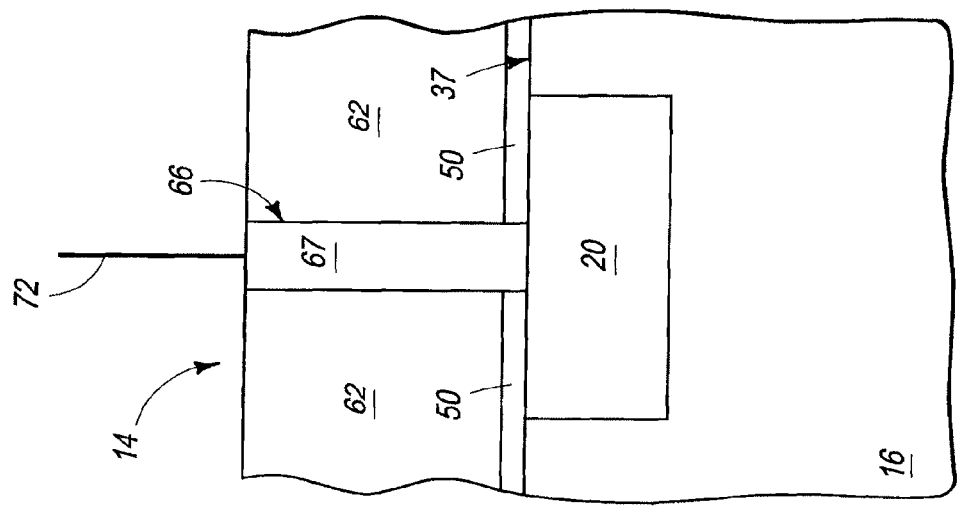
FIG. 24

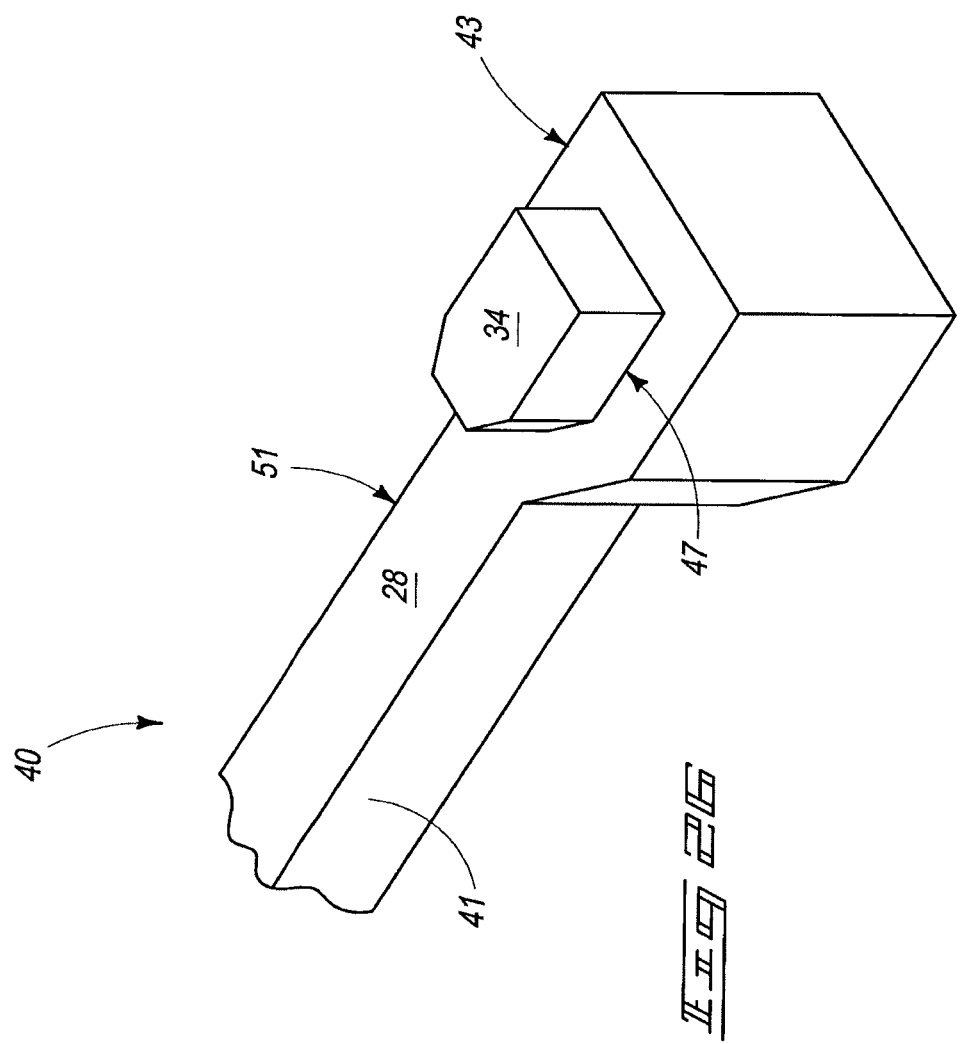

METHODS OF FORMING ELECTRICALLY CONDUCTIVE LINES

CROSS REFERENCE TO RELATED APPLICATION

This patent resulted from a divisional application of U.S. patent application Ser. No. 13/910,280 filed Jun. 5, 2013, entitled "Electrically Conductive Lines And Integrated Circuitry Comprising a Line of Recessed Access Devices", naming Brent Gilgen as inventor, which is a divisional application of U.S. patent application Ser. No. 12/710,981 filed Feb. 23, 2010, now U.S. Pat. No. 8,470,654, entitled "Methods Of Forming An Electrically Conductive Buried Line And An Electrical Contact Thereto, and Methods of Forming a Buried Access Line and an Electrical Contact Thereto", naming Brent Gilgen as inventor, the disclosures of which are incorporated by reference.

TECHNICAL FIELD

This invention relates to methods of forming electrically conductive lines, to methods of forming an electrically conductive line and an electrical contact thereto, to electrically conductive lines independent of method of manufacture, and to integrated circuitry comprising a line of recessed access devices independent of method of manufacture.

BACKGROUND

Longitudinally elongated electrically conductive lines are one type of component used to interconnect devices in integrated circuitry. Such may be formed by subtractive patterning and etch of conductive material. Alternately, a trench having a desired longitudinal outline of the conductive line may be formed in semiconductive or other material. Then, the trench may be wholly or partially filled with conductive material. The conductive material received laterally outward of the trench is then removed.

In some instances, the conductive material within the trench from which the line is formed may be recessed, for example by etching. Insulative material is ultimately provided within the trench over the recessed line, as well as over the substrate material within which the trench was formed. Such may occur with multiple depositions and processing steps that form other device components over or laterally spaced from the recessed line that is received within the trench.

Electrical connection is ultimately made to the recessed line and to other devices which are laterally spaced therefrom. For example, contact openings are etched through the insulative material to the outermost surfaces of the recessed lines and other devices, with such openings subsequently being filled with one or more conductive materials. The outermost conductive surface of the recessed line may be received considerably deeper within the substrate than is the outermost conductive surface of other device components that are laterally spaced from the recessed line. Accordingly, there is risk of over-etch into the conductive portions of these other device components while continuing a contact etch through insulative material to reach deeper to the recessed line. Such is accommodated for in the prior art by conducting at least one or more mask and etching steps for different elevation devices that are elevationally higher or outward of the recessed conductive lines.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

FIG. 8 is a view of the substrate of FIG. 6 at a processing step the same as that of FIG. 7.

FIG. 9 is a view of the substrate of FIG. 7 at a processing step subsequent to that of FIGS. 7 and 8.

FIG. 10 is a view of the substrate of FIG. 8 at a processing step the same as that of FIG. 9.

FIG. 12 is a sectional view taken through line 12-12 in FIG. 11.

FIG. 13 is a sectional view taken through line 13-13 in FIG. 11.

FIG. 14 is a view of the FIG. 11 substrate at a processing step subsequent to that shown by FIG. 11.

FIG. 15 is a sectional view taken through line 15-15 in FIG. 14.

FIG. 16 is a sectional view taken through line 16-16 in FIG. 14.

FIG. 18 is a view of the substrate of FIG. 16 at a processing step the same as that of FIG. 17.

FIG. 22 is a sectional view taken through line 21-21 in FIG. 21.

FIG. 24 is a view of the substrate of FIG. 22 with added schematic representation.

FIG. 25 is a diagrammatic perspective view of a portion of the components of the substrate at the processing stage of FIGS. 9 and 10.

DETAILED DESCRIPTION OF EXAMPLE EMBODIMENTS

Embodiments of the invention encompass methods, electrically conductive lines, and integrated circuitry comprising a line of recessed access devices. Example such embodiments are described with reference to FIG. 1-27. The discussion proceeds with reference to the fabrication of integrated circuitry comprising a line of recessed access devices, for example as might be used in memory circuitry. The disclosure is, however, in no way so limited, and encompasses methods of forming any electrically conductive line, and to electrically conductive lines and to integrated circuitry incorporating electrically conductive lines independent of method of manufacture.

Figure 1:
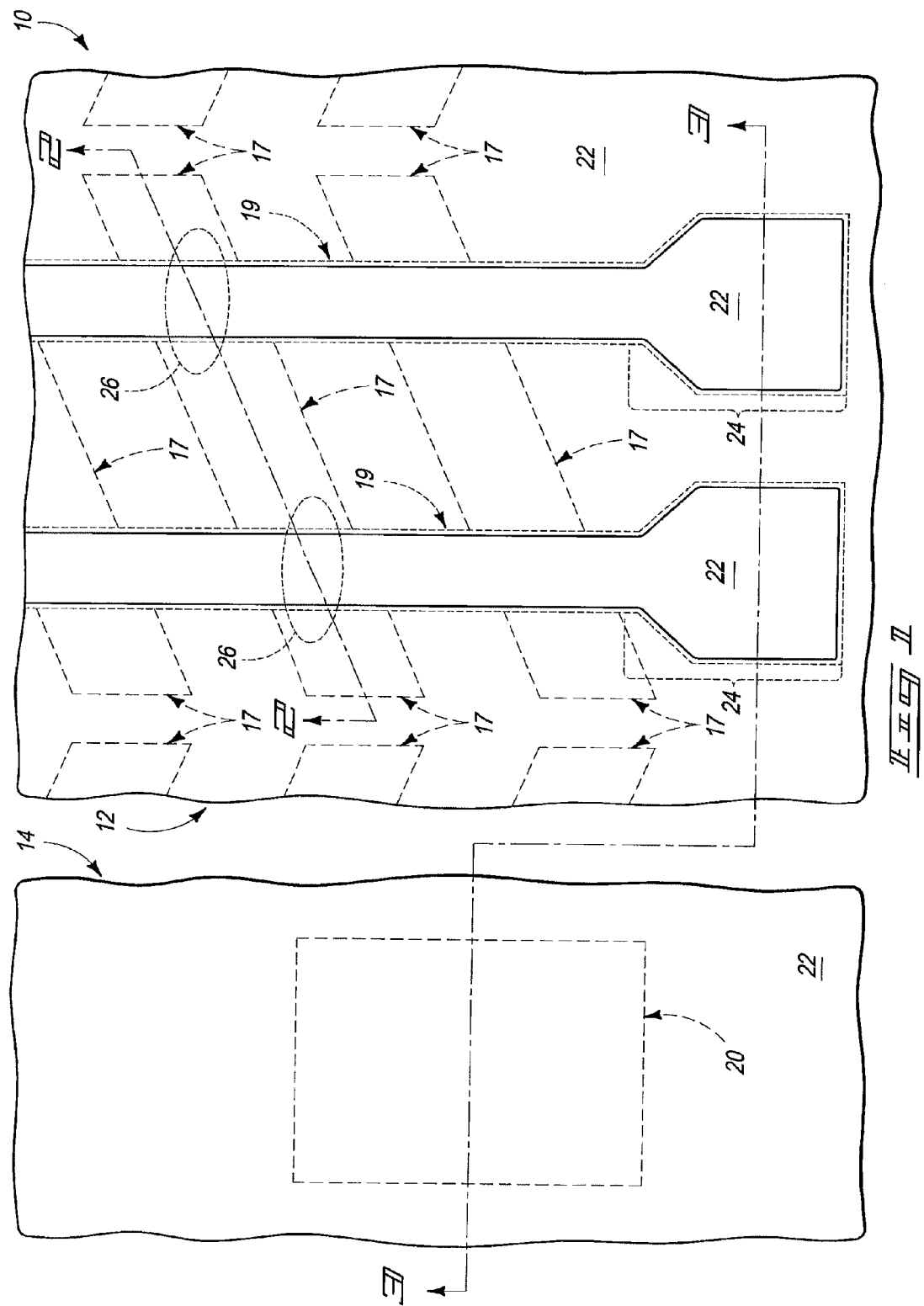
FIG. 1 is a diagrammatic top plan view of a portion of a substrate in process in accordance with an embodiment of the invention.
Figure 2:
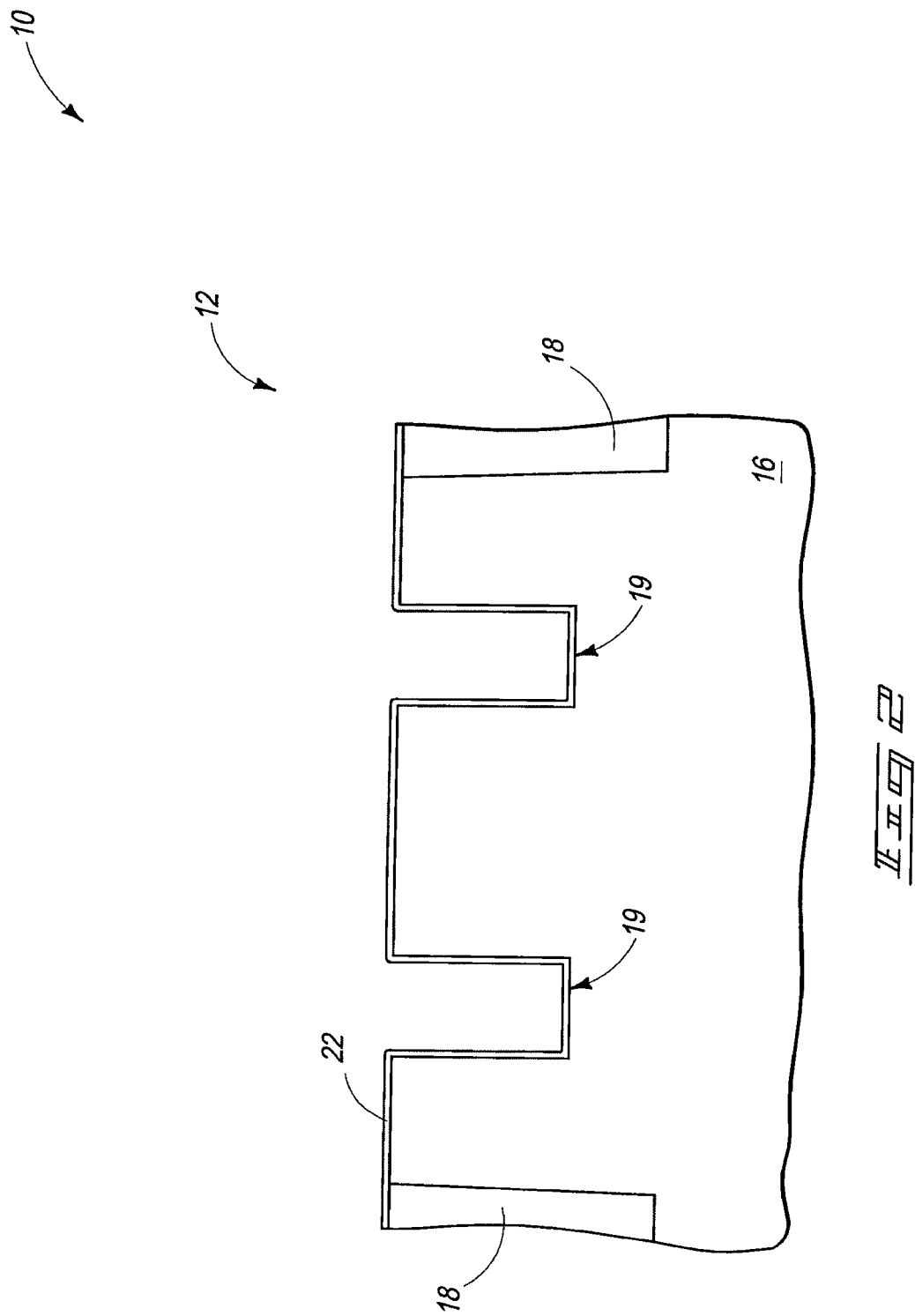
FIG. 2 is a sectional view taken through line 2-2 in FIG. 1.
Figure 3:
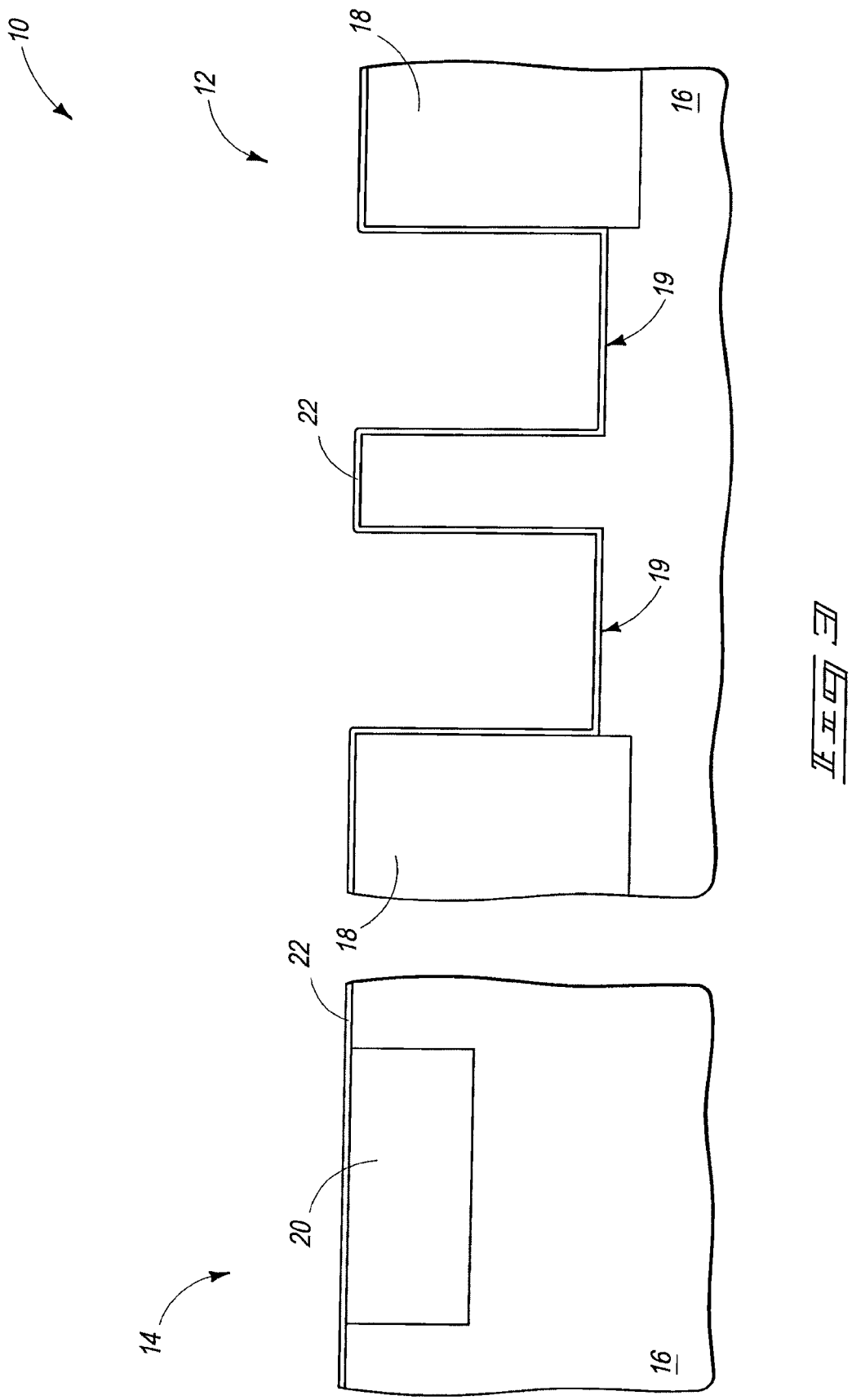
FIG. 3 is a sectional view taken through line 3-3 in FIG. 1.

Referring initially to FIGS. 1-3, a substrate fragment 10 in process comprises two portions 12 and 14. In one example, portion 12 may comprise a memory array area in which recessed access devices will be fabricated and portion 14 may comprise a portion peripheral to the memory array area. Substrate 10 may comprise multiple different insulative, semiconductive, and conductive materials. For example, substrate 10 may comprise a substrate material 16 that may be semiconductive and comprise monocrystalline silicon. A material 18 may comprise insulative trench isolation which defines and effectively separates spaced active area regions 17 which comprise semiconductive material 16. A region 20 in circuitry area 14 comprises an example region to which electrical contact through insulating material will ultimately be made.

A plurality of longitudinally elongated trenches 19 have been formed within substrate material 16. Reference is hereafter made to fabrication associated with a single trench 19, although the same attributes which are described may or may not apply to all trenches 19. Trench 19 includes a gate dielectric lining 22, for example, silicon dioxide deposited to a thickness of 6 nanometers. Trench 19 is laterally wider at a first longitudinal location or portion 24 in comparison to some second longitudinal location or portion 26. In one embodiment, first portion 24 comprises an end portion of the trench, with second portion 26 comprising another longitudinal portion of the trench that is longitudinally spaced from end portion 24. In an alternate embodiment (not shown), first longitudinal location/portion 24 is not at an end of trench 19. However, reference is made hereafter to a conductive line with a longitudinal end portion 24, but is not so limited.

Figure 4:
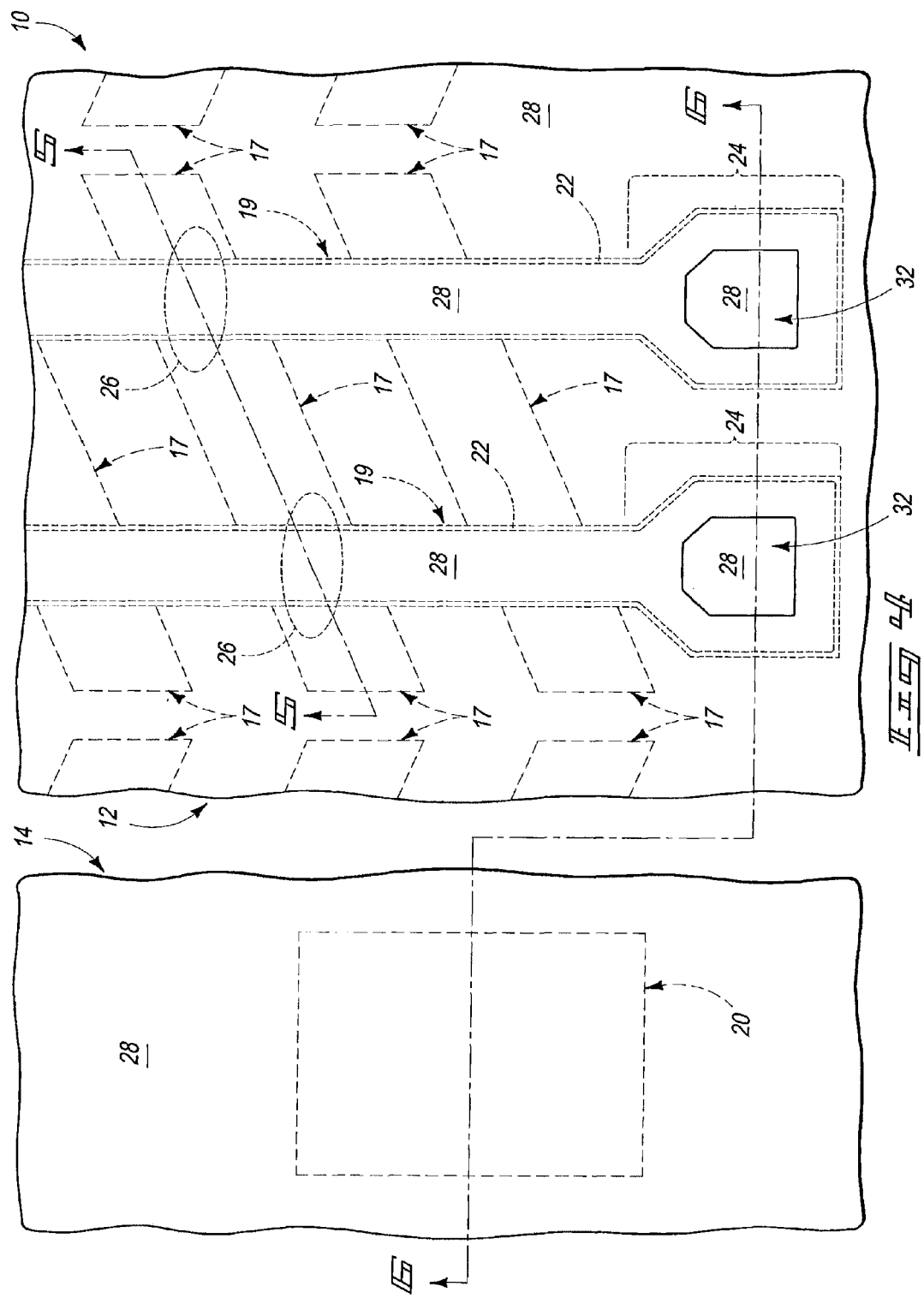
FIG. 4 is a view of the FIG. 1 substrate at a processing step subsequent to that shown by FIG. 1.
Figure 5:
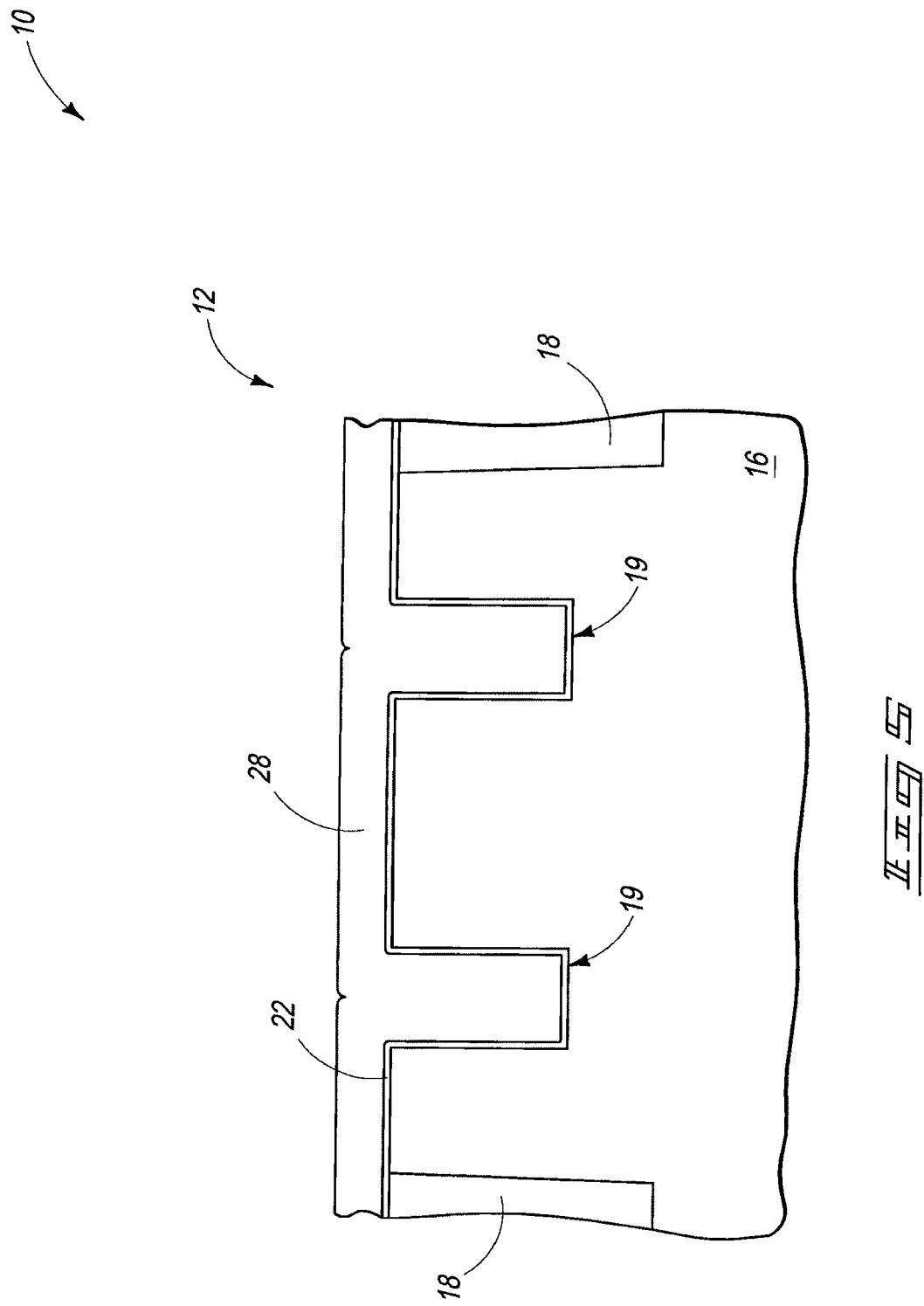
FIG. 5 is a sectional view taken through line 5-5 in FIG. 4.
Figure 6:
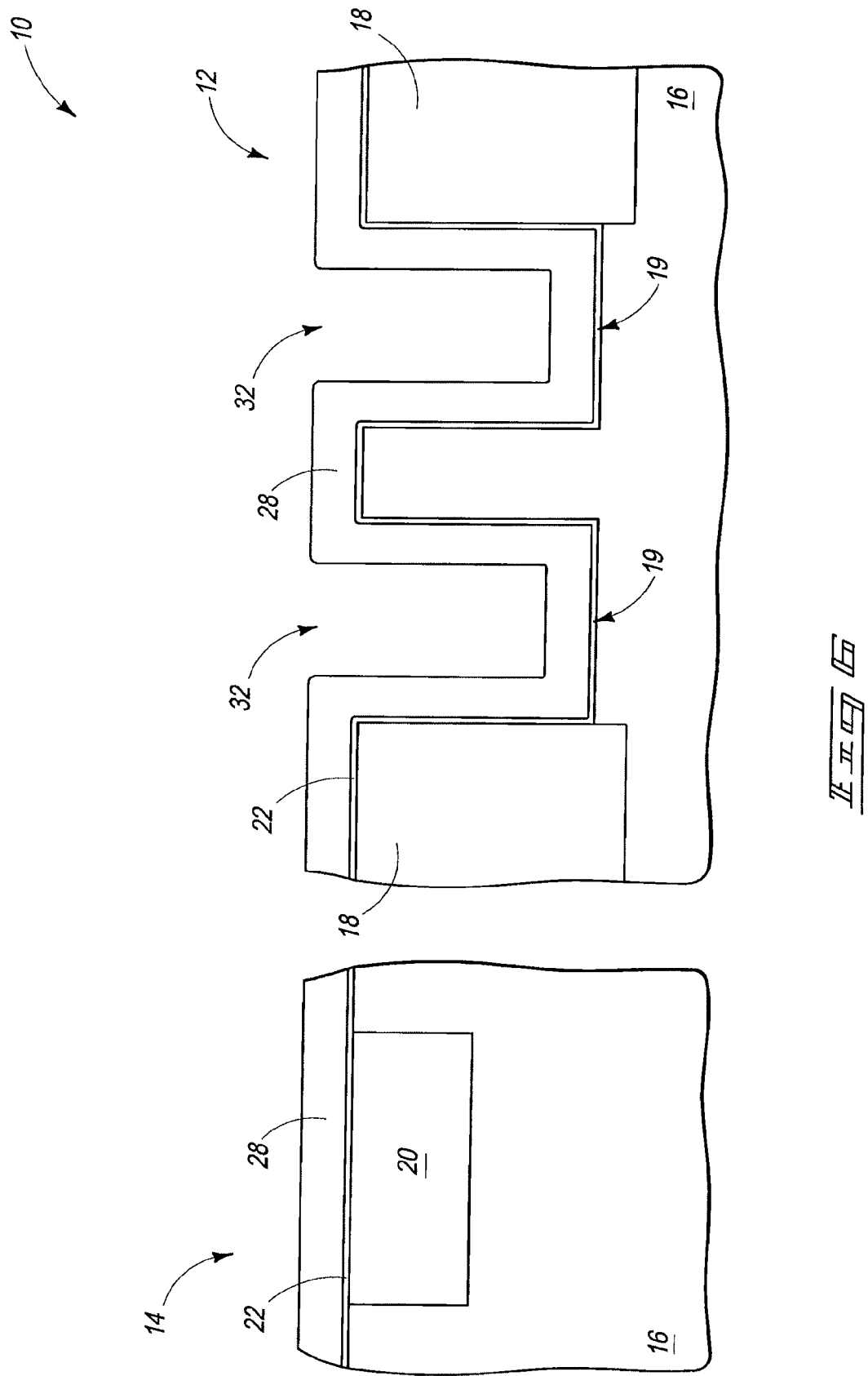
FIG. 6 is a sectional view taken through line 6-6 in FIG. 4.

Referring to FIGS. 4-6, a first conductive material 28 has been deposited to within trench 19. Such may be homogenous or non-homogenous. Example materials include one or more elemental metals, an alloy of elemental metals, conductive metal compounds, and conductively doped semiconductive material. In one embodiment, first conductive material 28 may be deposited to fill trench 19 at second location 26 and to less than fill and to line trench 19 at first location 24. In one embodiment, first conductive material 28 may be deposited within trench 19 to fill laterally across at least a lowest elevation of trench 19 at longitudinal portion 26 and to form a conductive ring-like lining portion against sidewalls of trench 19 in longitudinal end portion 24. The conductive ring-like lining portion forms a void space 32 within longitudinal end portion 24. In one embodiment, first conductive material 28 may be received over substrate material 16/18/22 laterally outward of trench 19. Further in one embodiment, first conductive material 28 may be deposited to overfill trench 19 at longitudinal portion 26. In the part of trench 19 shown in FIG. 4, the entire longitudinal length of the trench is overfilled with conductive material 28 but for end portion 24.

Figure 7:
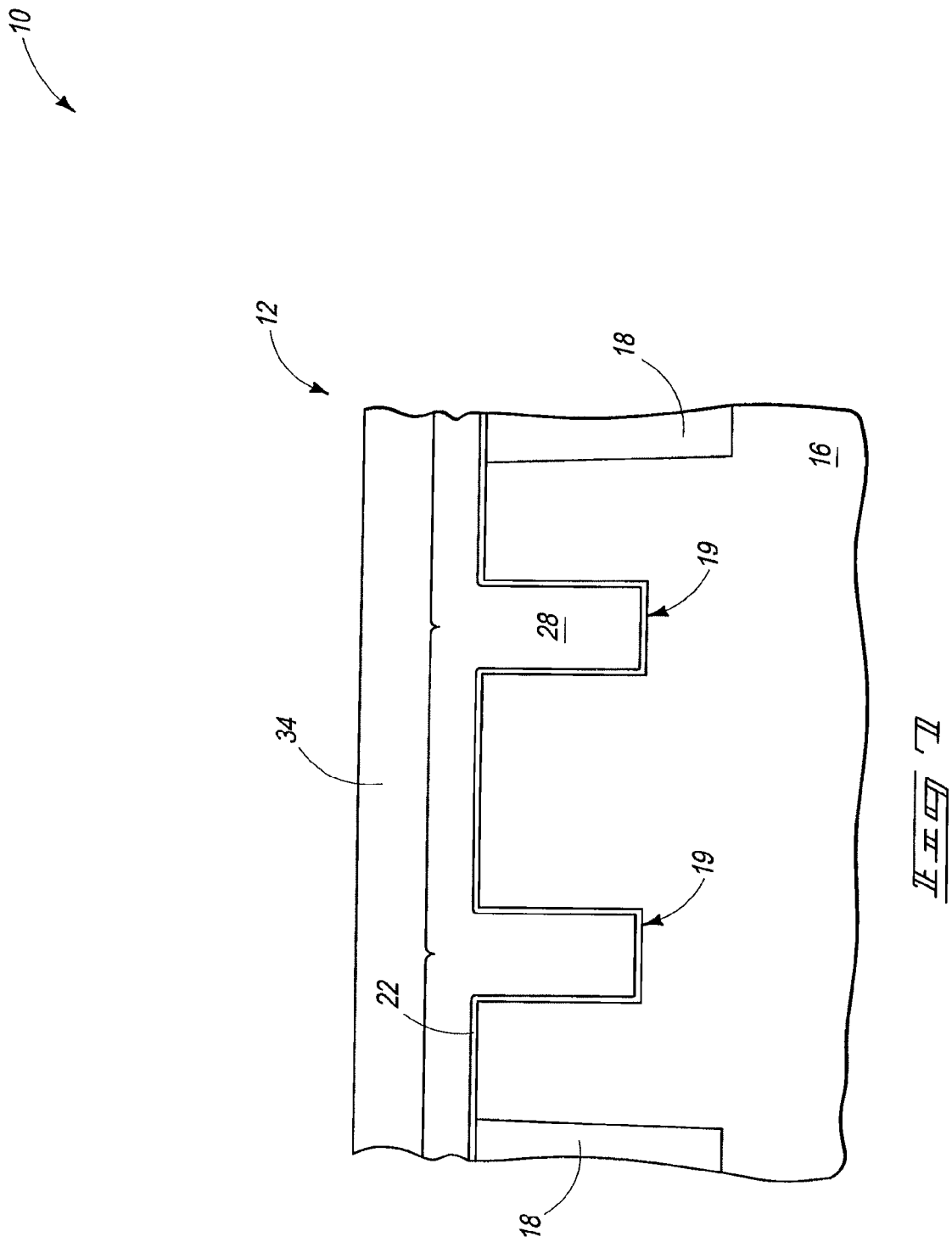
FIG. 7 is a view of the substrate of FIG. 5 at a processing step subsequent to that of FIG. 5.

Referring to FIGS. 7 and 8, a second conductive material 34 has been deposited over first location 24 and over second location 26 of trench 19 in electrical connection with first conductive material 28. Second conductive material 34 may be homogenous or non-homogenous. Such may comprise one or more elemental metals, an alloy of elemental metals, a conductive metal compound, or conductively doped semiconductive material. In one embodiment, second conductive material 34 may be received over first conductive material 28 laterally outward of trench 19. In one embodiment, second conductive material 34 may be received within trench 19 at first location 24, but not within trench 19 at second location 26. Second conductive material 34 may fill or overfill trench 19 at second location 26. In one embodiment where first conductive material 28 forms a conductive ring-like lining portion, second conductive material 34 is deposited to within void space 32 in electrical connection with first conductive material 28. In one embodiment, sidewalls of second conductive material 34 within trench 19 at first location 24 are effectively lined by first material 28.

In one embodiment, first and second conductive materials 28, 34 respectively, are of different composition relative one another. In one embodiment, the first conductive material comprises or TiN and the second conductive material comprises W. In one embodiment, the first conductive material consists essentially of TiN and the second conductive material consists essentially of W.

Referring to FIGS. 9 and 10, outermost portions of first and second conductive materials 28, 34, respectively, have been removed back at least to substrate material 16/18/22 to remove the first and second conductive materials from being received over such substrate material laterally outward of trench 19. In the depicted example embodiment, such removing has occurred effective to also remove gate dielectric 22 from being received over semiconductor material 16 and from being received over isolation material 18 laterally outward of trench 19. Further, some of materials 16 and 18 may also be removed. Regardless, the removing may be conducted by any suitable mechanical polishing, etch back, or chemical mechanical polishing technique.

FIGS. 9 and 10 depict fabrication of an electrically conductive line 40 in accordance with an embodiment of the invention. Embodiments of the invention also encompass methods of forming a conductive line and an electrical contact thereto. In one embodiment and as will be inherent from the continuing discussion, conductive line 40 comprises a buried access line, for example a word line, to which electrical connection will be made within longitudinal end portion 24.

In one embodiment, second conductive material 34 at first location 24 may be considered as having an uppermost surface 36, and substrate material 16/18/22 may be considered as having an uppermost surface 37. Surfaces 36 and 37 may or may not be planar after the removing of materials 28 and 34 laterally outward of trench 19. In one embodiment, uppermost surface 36 after the removing is planar and within about 10 nanometers of uppermost surface 37. In the depicted embodiment, surfaces 36 and 37 are planar and elevationally coincident (i.e., they are coplanar).

Figure 11:
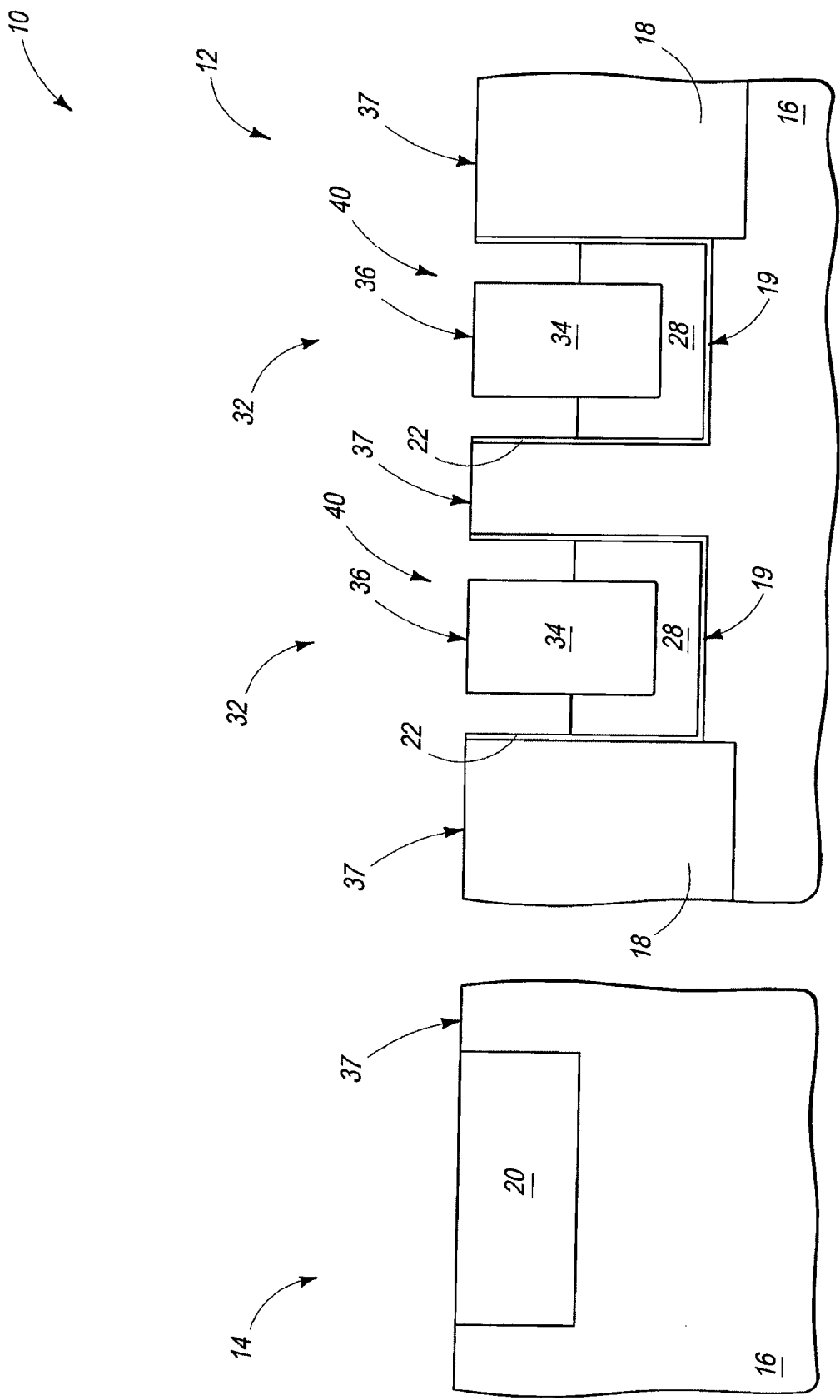
FIG. 11 is a view of the FIG. 4 substrate at a processing step subsequent to that shown by FIGS. 9 and 10.

Referring to FIGS. 11-13, an upper part of first conductive material 28 that lines trench 19 at least at first location 24 has been removed to elevationally recess first conductive material 28 within trench 19 relative to uppermost surface 36 of second conductive material 34. In one embodiment, at least an uppermost part of first conductive material 28 may also be removed at second location 26 to elevationally recess first conductive material 28 within trench 19 at second location 26. In one embodiment, such occurs simultaneously with the removing of first conductive material 28 at first location 24. Regardless, removal of material 28 may be conducted by etching first conductive material 28 selectively relative to substrate material 16/18/22 and selectively relative to second conductive material 34. For example where first conductive material 28 comprises TiN and second conductive material 34 comprises W, a dry chlorine (Cl$_2$) based chemistry may be used to etch TiN selectively relative to W at a removal rate ratio of from about 15:1 to about 20:1. In the context of this document, a selective etch requires removal of the one conductive material being etched at a rate of at least 5.0 times that of the other conductive material exposed during the etch.

In one embodiment where a conductive ring-like lining portion of first conductive material 28 is formed against sidewalls of trench 19 in longitudinal end portion 24, at least an uppermost part of the ring-like portion is removed to elevationally recess the ring-like portion relative to an uppermost surface 36 of second conductive material 34 within longitudinal end portion 24. In one embodiment where the first and second conductive materials are of different composition relative one another, the selective etching may leave second conductive material 34 projecting elevationally outward relative to first conductive material 28 within longitudinal end portion 24 of trench 19, for example as shown.

Uppermost surface 36 of second conductive material 34 and uppermost surface 37 of substrate material 16/18/22 may or may not each move elevationally inward while etching first conductive material 28. Further if both of such so move, the degree of inward movements may not be the same relative one another. Regardless, in one embodiment, remaining uppermost surface 36 at location 24 after the etching may be within about 10 nanometers of uppermost surface 37. In one embodiment and as shown, surfaces 36 and 37 are each planar and elevationally coincident after such etching.

Referring to FIGS. 14-16, conductive diffusion regions 44, 46, 48 have been fabricated, for example by ion implantation, to function as source/drain regions of field effect transistors. Insulative material 50 has been formed over substrate 10 to fill remaining volume of trenches 19. Such may be homogenous or non-homogenous, with doped or undoped SiO$_2$ being examples. A contact opening 52 has been formed through insulative material 50 to diffusion region 46. A data/sense line, for example a bit line, construction 54 has been formed over insulative material 50 and in electrical connection with diffusion region 46 through contact opening 52. Bit line construction 54 includes suitable conductive material 56 and an insulative cap 58 thereover.

Figure 17:
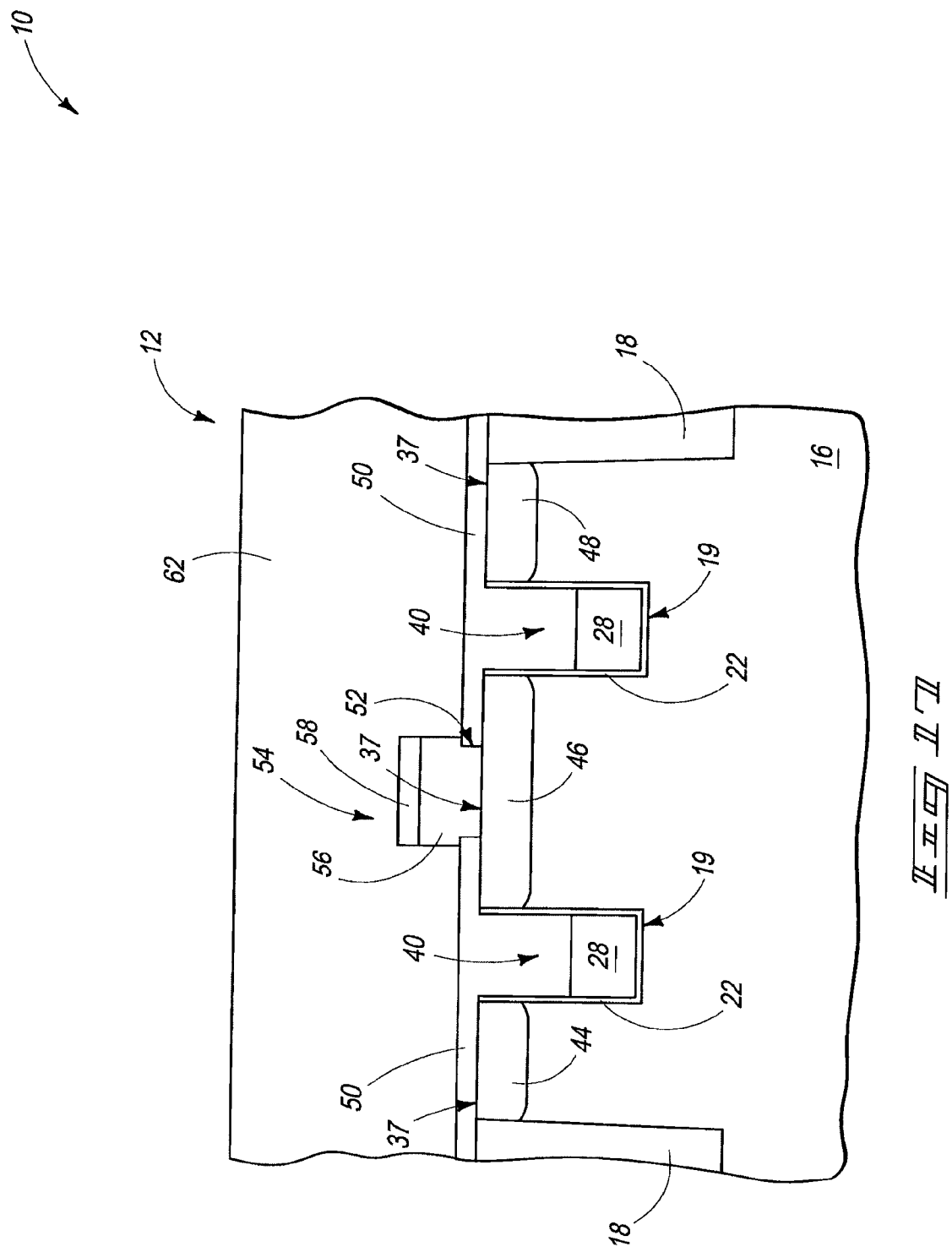
FIG. 17 is a view of the substrate of FIG. 15 at a processing step subsequent to that of FIG. 15.

Referring to FIGS. 17 and 18, an insulative material 62 has been formed over substrate 10 and accordingly over longitudinal end portion 24 of trench 19. Such may be homogenous or non-homogenous. Example materials include doped SiO$_2$, such as phosphosilicate glass or borophosphosilicate glass.

Figure 19:
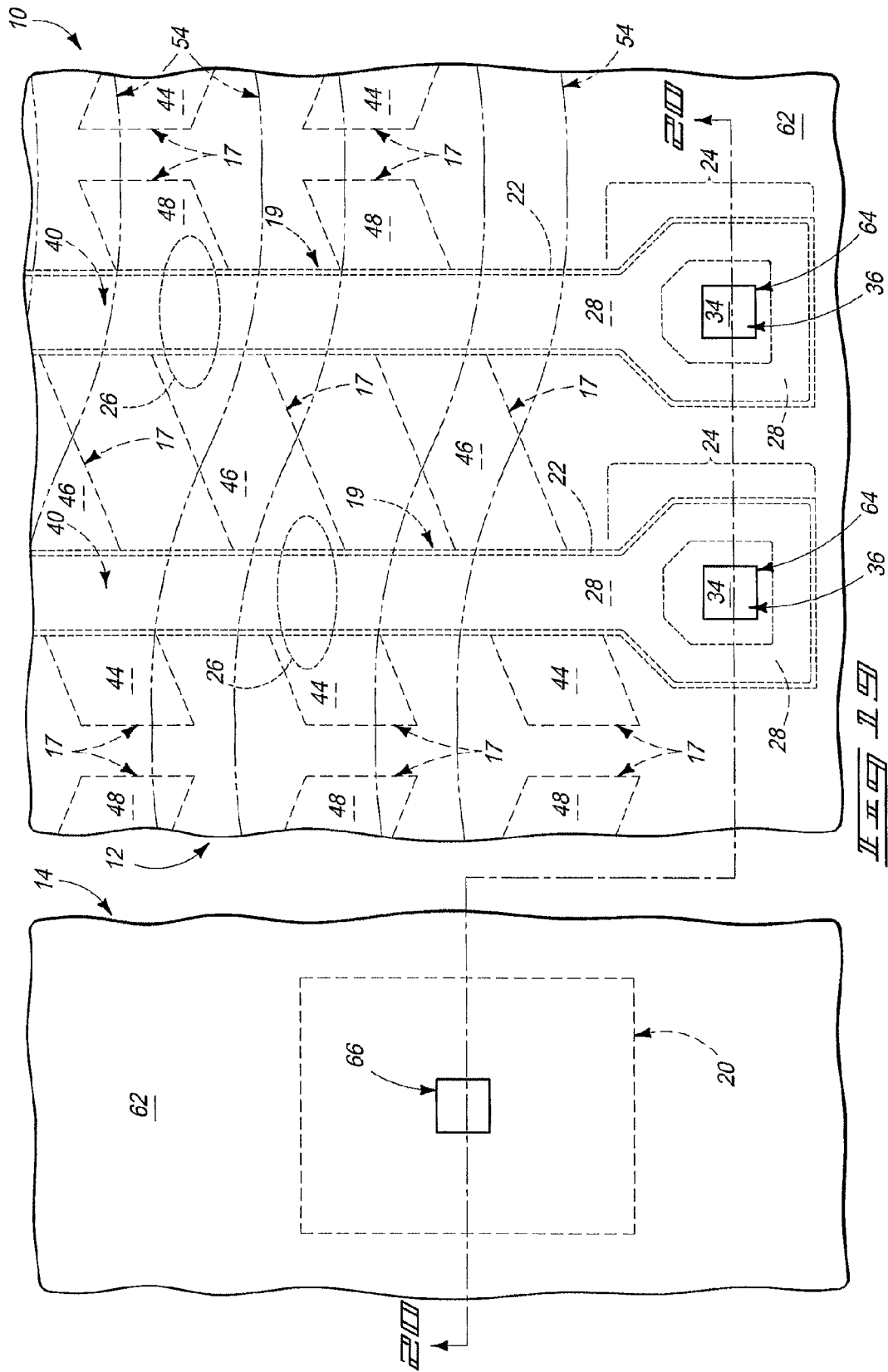
FIG. 19 is a view of the FIG. 14 substrate at a processing step subsequent to that shown by FIGS. 17 and 18.
Figure 20:
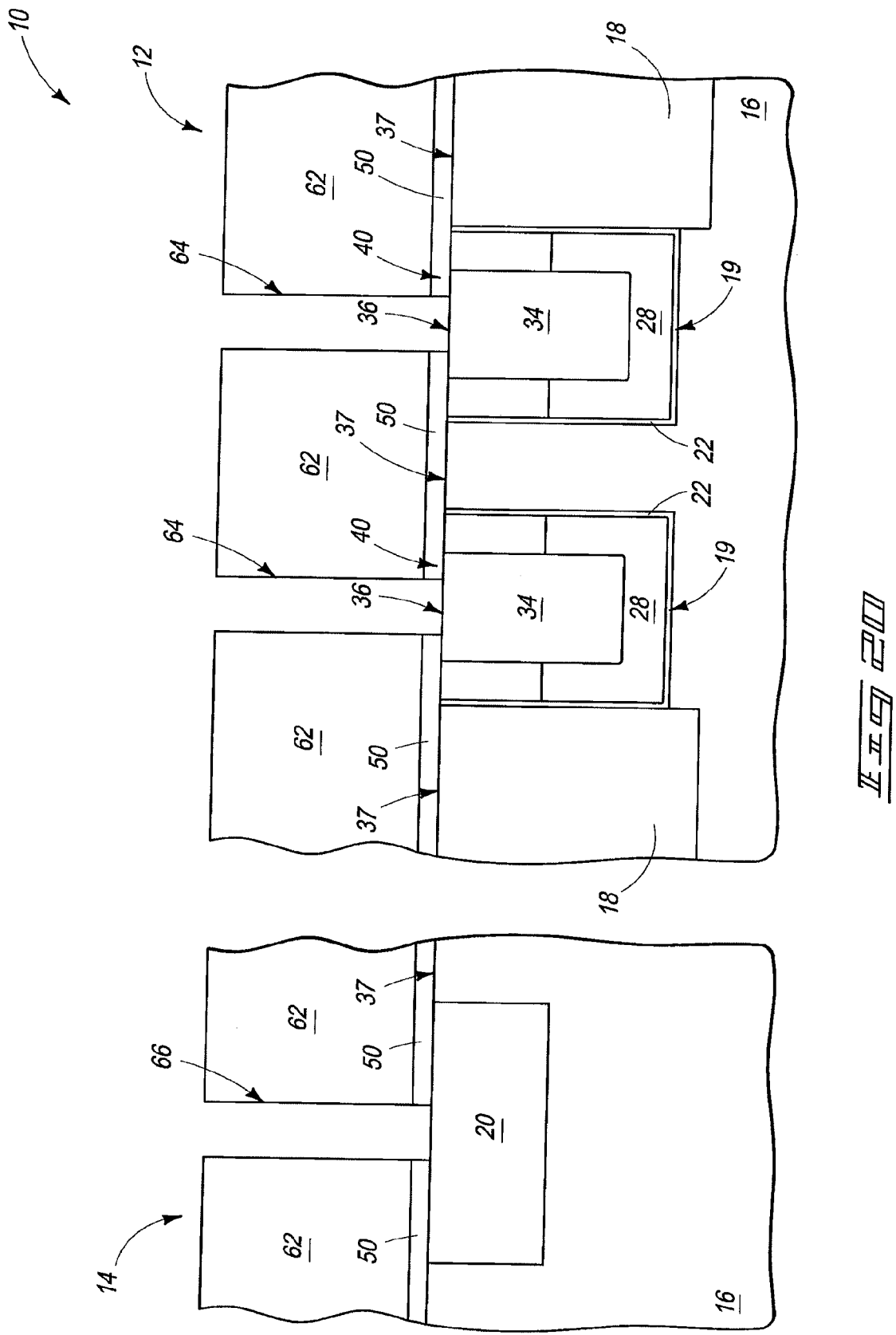
FIG. 20 is a sectional view taken through line 20-20 in FIG. 19.

Referring to FIGS. 19 and 20, a contact opening 64 has been etched into insulative material 62/50 over second conductive material 34 projecting elevationally outward relative to first conductive material 28 within longitudinal end portion 24 of trench 19. In the depicted example, contact opening 64 extends to conductive material 34. A contact opening 66 has also been etched through insulative material 62/50 over region 20 in circuitry portion 14.

Figure 21:
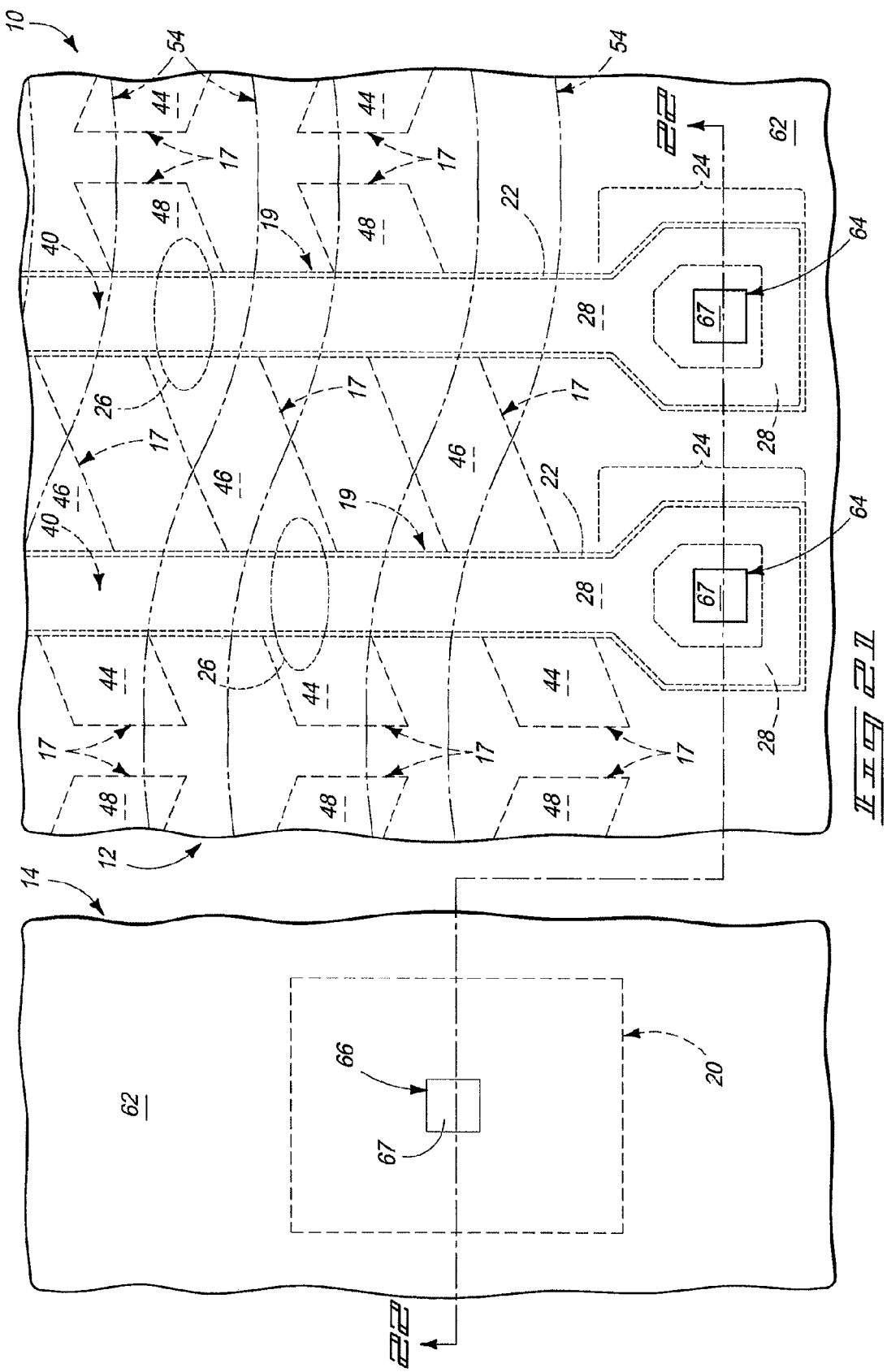
FIG. 21 is a view of the FIG. 19 substrate at a processing step subsequent to that shown by FIG. 19.

Referring to FIGS. 21 and 22, conductor material 67 has been formed within contact opening 64 in electrical connection with second conductive material 34 and in contact opening 66 in electrical connection with region 20. Such may be formed by deposition of one or more conductive materials followed by planarization back at least to the outermost surface of insulative material 62. Example materials 67 include one or more elemental metals, an alloy of elemental metals, conductive metal compounds, and conductively doped semiconductive material.

Figure 23:
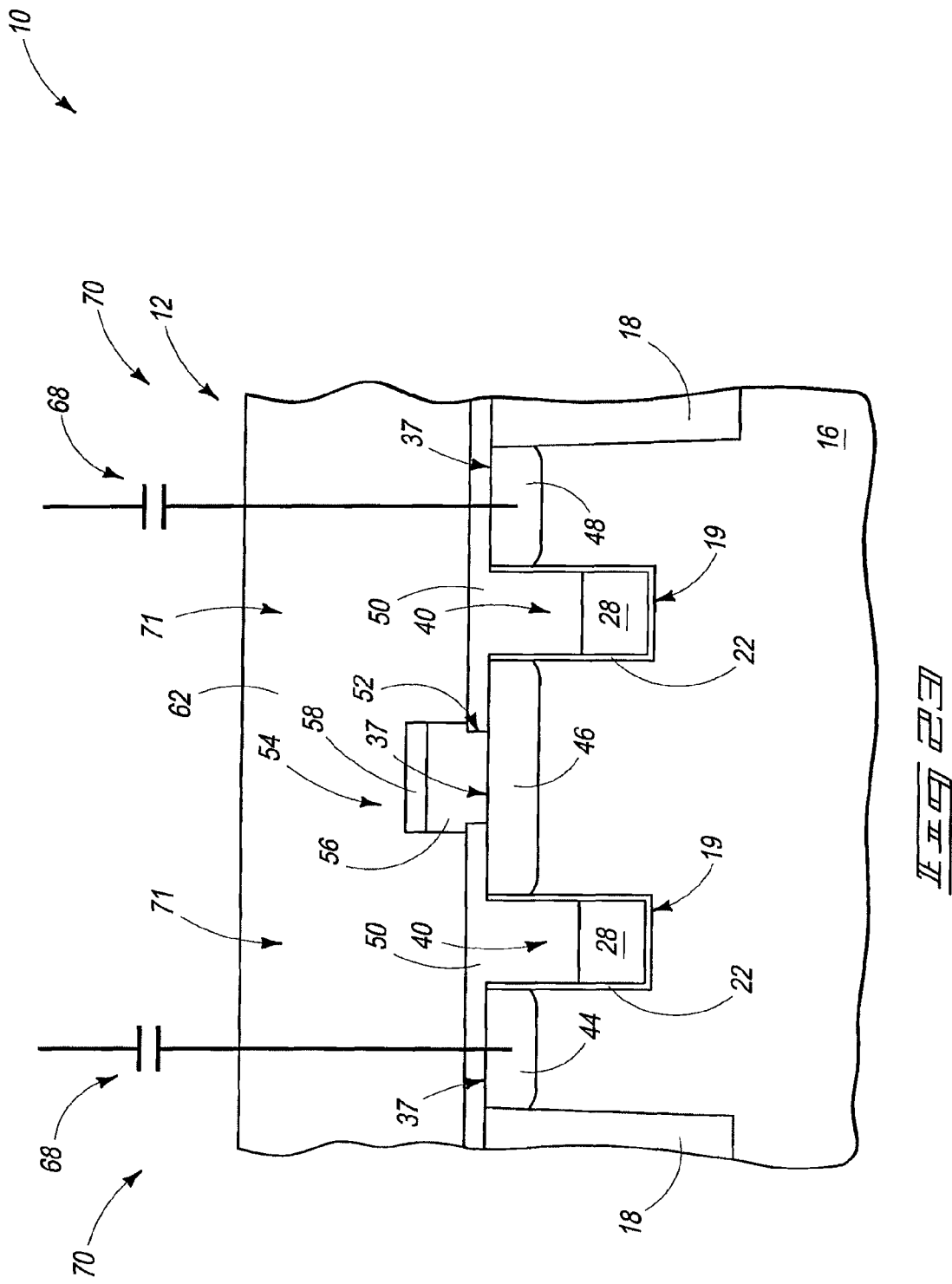
FIG. 23 is a view of the FIG. 17 substrate with added schematic representation, and may not necessarily correspond in processing sequence to that of FIG. 17.

FIG. 23 schematically depicts an individual capacitor 68 electrically connected to each source/drain diffusion region 44 and 48. Bit line construction 54 electrically connects with shared source/drain diffusion region 46, whereby a pair of memory cells 70 are formed which include a pair of recessed access transistor devices 71. Electrically conductive lines 40 are respectively formed to comprise a line of gates of a plurality of recessed access transistors to which electrical contact is made by a conductive via received over a respective electrically conductive gate line 40 at first location 24. For example, FIG. 24 schematically depicts electrical connections 72 at first location 24 of electrically conductive gate line 40, and with respect to contact region 20 in circuitry area 14.

In accordance with an embodiment of the invention, and independent of method, an electrically conductive line comprises a longitudinally elongated conductive body which comprises first and second different composition conductive materials. For example, FIG. 25 depicts conductive line 40 of the FIGS. 8 and 9 construction wherein all surrounding material has been removed for clarity. Accordingly, electrically conductive line 40 may be considered as comprising a longitudinally elongated conductive body 41 which comprises first and second different composition conductive materials 28, 34, respectively. A longitudinal end part 43 of first conductive material 28 of body 41 may be considered as being of a spoon-like shape having a receptacle 47, and wherein second conductive material 34 fills receptacle 47. In one embodiment and as shown, longitudinal end part 43 of the conductive body 41 may be wider than a longitudinal part 51 of conductive body 41 adjacent thereto. In the context of this document, a spoon-like shape comprises a longitudinally extending stem terminating in a receptacle.

Figure 26:
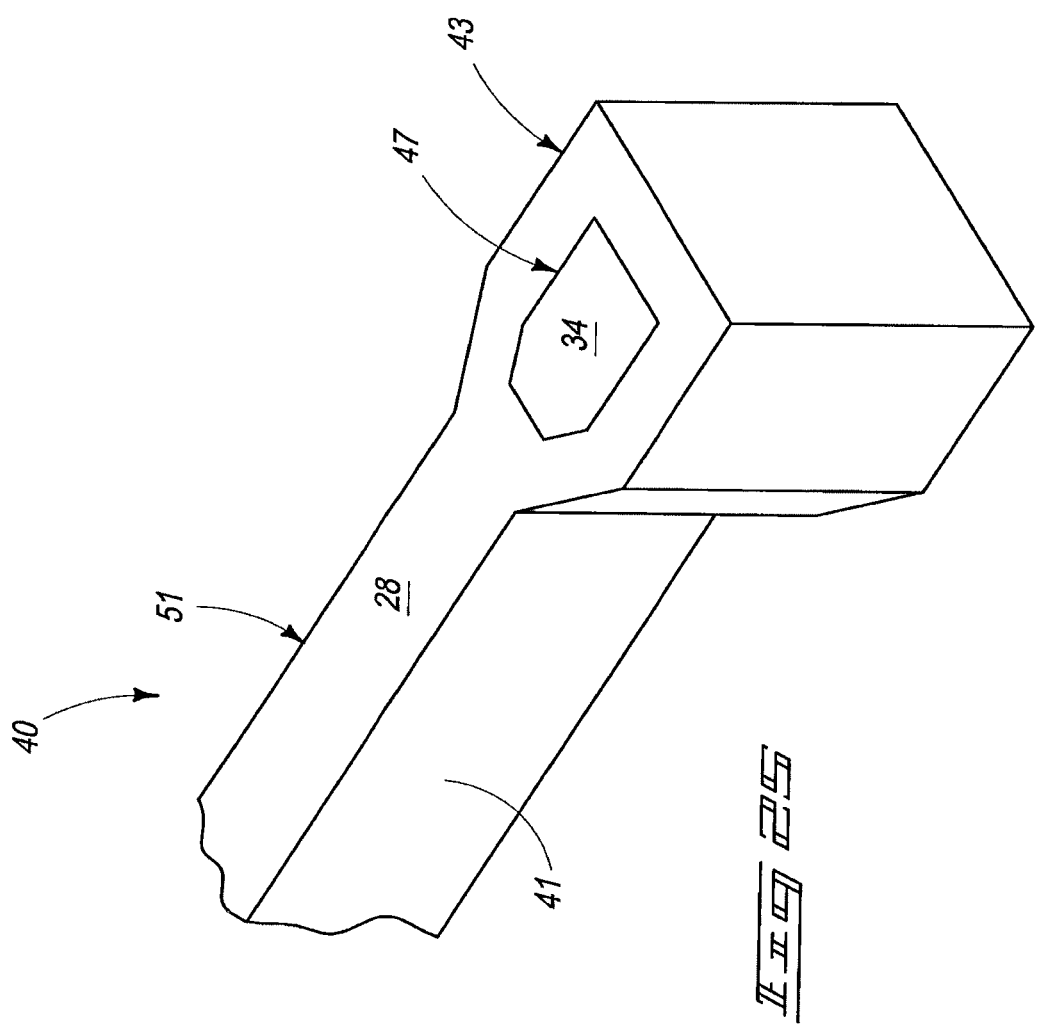
FIG. 26 is a diagrammatic perspective view of a portion of the components of the substrate at the processing stage of FIGS. 11-13.

FIG. 26 depicts electrically conductive line 40 of FIGS. 11-13 wherein all surrounding material has been removed for clarity. In such, second conductive material 34 overfills receptacle 47 and thereby projects elevationally outward thereof.

In one embodiment, and independent of method, an electrically conductive line comprises a longitudinally elongated conductive body 41 having a longitudinal end portion 43 that is laterally wider than another longitudinal portion 51 that is spaced from the end portion 43. Conductive body 41 comprises first and second different composition conductive materials 28, 34, respectively, with first conductive material 28 forming a receptacle 47 at longitudinal end portion 43. Second conductive material 34 overfills and projects elevationally outward of the receptacle 47. An example embodiment of such an electrically conductive line 40 is that depicted in FIG. 26.

Figure 27:
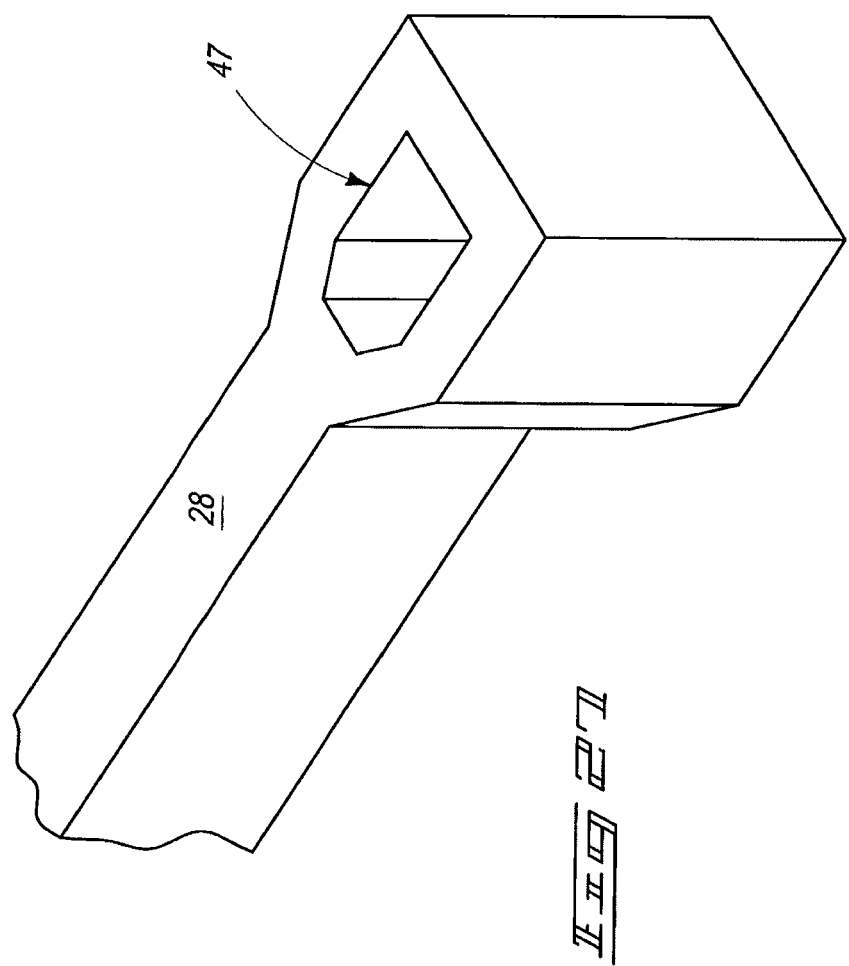
FIG. 27 is a diagrammatic perspective view of a portion of the components of the substrate at the processing stage of FIGS. 4-6.

In one embodiment, a method of forming an electrically conductive buried line and an electrical contact thereto comprises forming a longitudinally elongated conductive line within a trench in substrate material. A longitudinal end part of the line within the trench is of spoon-like shape thereby having a receptacle. FIGS. 4-6 depict such an example longitudinally elongated conductive line. FIG. 27 is a perspective of FIGS. 4-6 wherein all material is not shown except that portion of conductive material 28 that is received within the trench thereby forming the FIG. 27 conductive line.

Receptacle 47 is then filled with conductive material. For example, FIGS. 7 and 8 are an example of such filling with respect to conductive material 34. FIGS. 7 and 8 also depict an example embodiment wherein the receptacle has been overfilled with conductive material.

Insulative material is formed over conductive material 34 that is within receptacle 47, for example as shown in FIGS. 16-18. A contact opening 64 is formed over conductive material 34 that is within the receptacle (FIGS. 19 and 20). Conductor material 67 is formed in the contact opening in electrical connection with second conductive material 34 that is within the receptacle.

In one embodiment, volume of receptacle 47 is reduced after such has been filled with conductive material. For example and by way of example only, the processing going from FIGS. 25 to 26 (also going from FIGS. 10 to 13) depicts reduction of the receptacle volume within which conductive material 34 is received.

In one embodiment, elevational thickness of conductive line 40 is reduced prior to forming insulative material within which the contact opening is formed. The processing going from FIGS. 25 to 26 (also going from FIGS. 9 and 10 to FIGS. 11-13) depicts such an example. Further and in one embodiment, the longitudinally conductive line is etched selectively relative to conductive material 34 within the receptacle before forming insulative material 50/62 within which the contact opening is formed. Such is also shown by way of example only in the processing going from FIGS. 25 to 26 (also going from FIGS. 9 and 10 to FIGS. 11-13).

An embodiment of the invention encompasses a method of forming an electrically conductive buried line and an electrical contact thereto. Such includes forming a longitudinally elongated conductive line having a longitudinal end portion that is laterally wider than another longitudinal portion that is spaced from the end portion. The conductive line comprises first and second different composition conductive materials. The first conductive material forms a receptacle at the longitudinal end portion, and the second conductive material overfills such receptacle.

Insulative material is formed over the second conductive material that is within the receptacle. A contact opening is formed within the insulative material over the second conductive material that is within the receptacle. Conductor material is formed in the contact opening in electrical connection with the second conductive material that is within the receptacle.

In one embodiment, volume of the receptacle is reduced before forming the insulative material, for example by selectively etching the first conductive material relative to the second conductive material. Processing may otherwise occur as described above.

An embodiment of the invention includes integrated circuitry comprising a line of recessed access devices. Such line comprises an electrically conductive gate line received within a longitudinally elongated trench in semiconductive material. The trench comprises gate dielectric sidewalls, and the gate line comprises a longitudinally elongated conductive body comprising first and second different composition conductive materials. A longitudinal end part of the first conductive material of the body is of spoon-like shape thereby having a receptacle. The second conductive material fills the receptacle.

The line of recessed access devices comprises longitudinally spaced pairs of source/drain regions received laterally adjacent the gate line and longitudinally separated by insulative material. Such is shown, in but one example, in FIG. 21. Active area pairs 44/46 and 46/48 are received within active areas 17 and longitudinally separated therebetween by insulative material 18 (shown by and described above with reference to FIGS. 1-3).

A conductive contact is provided to the gate line, with such being received over and to the second conductive material that fills the receptacle, for example as shown in FIGS. 21 and 22. Such may encompass any of the other attributes as described above.

Another embodiment of the invention encompasses integrated circuitry comprising a line of recessed access devices. Such a line comprises an electrically conductive gate line received within a longitudinally elongated trench in semiconductive material. The trench comprises gate dielectric sidewalls, and the gate line comprises a longitudinally elongated conductive body having a longitudinal end portion that is laterally wider than another longitudinal portion that is spaced from the end portion. The conductive body comprises first and second different composition conductive materials. The first conductive material forms a receptacle at the longitudinal end portion. The second conductive material overfills and projects elevationally outward of the receptacle.

Longitudinally spaced pairs of source/drain regions are received laterally adjacent the gate line and longitudinally separated by insulative material. A conductive contact electrically connects with the gate line, with such contact being received over and to the second conductive material that overfills the receptacle.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an electrically conductive line, comprising:
   providing a longitudinally elongated trench within a substrate, the trench being laterally wider at a first longitudinal location in comparison to a second longitudinal location;
   depositing a first conductive material to fill the trench at the second location and to less than fill and to line the trench at the first location;
   depositing a second conductive material within the trench at the first location in electrical connection with the first conductive material, the first conductive material lining sidewalls of the second conductive material within the trench at the first location; and
   removing at least an uppermost part of the first conductive material that lines the trench at the first location to elevationally recess the first conductive material within the trench relative to an uppermost surface of the second conductive material at the first location.

2. The method of claim 1 wherein the trench comprises a gate dielectric lining and the electrically conductive line is formed to comprise a line of gates of recessed access transistors to which electrical contact is made by a conductive via received over the electrically conductive line at the first location.

3. The method of claim 1 comprising removing at least an uppermost part of the first conductive material at the second location to elevationally recess the first conductive material within the trench at the second location simultaneously with said removing of first conductive material that lines the trench at the first location.

4. The method of claim 1 wherein the first and second conductive materials are of different composition relative one another, and said removing comprises selectively etching of the first conducive material relative to the second conductive material.

5. The method of claim 4 wherein the first conductive material comprises TiN and the second conductive material comprises W.

6. The method of claim 4 wherein the first conductive material consists essentially of TiN and the second conductive material consists essentially of W.

7. The method of claim 1 wherein the trench is provided within substrate material, the uppermost surface of the second conductive material at the first location being planar and within about 10 nanometers of an uppermost planar surface of said substrate material after said removing.

8. The method of claim 7 wherein the uppermost surface of the second conductive material at the first location is elevationally coincident with the uppermost surface of said substrate material after said removing.

9. The method of claim 1 wherein the trench comprises a gate dielectric lining and the electrically conductive line is formed to comprise a line of gates of recessed access transistors.

10. The method of claim 1 wherein the first and second conductive materials are of different composition relative one another.

11. A method of forming an electrically conductive line, comprising:
    providing a longitudinally elongated trench within a substrate, the trench having a longitudinal end portion that is laterally wider than another longitudinal portion;
    depositing a first conductive material within the trench to fill laterally across at least a lowest elevation of the trench at the another longitudinal portion and to form a conductive ring-like lining portion against sidewalls of the trench in the longitudinal end portion, the conductive ring-like lining portion forming a void space in the longitudinal end portion;
    depositing a second conductive material to within the void space in electrical connection with the first conductive material; and
    removing at least an uppermost part of the conductive ring-like lining portion to elevationally recess it relative to an uppermost surface of the second conductive material within the longitudinal end portion.

12. The method of claim 11 wherein the depositing of the first conductive material overfills the trench at the another longitudinal portion.

13. The method of claim 11 wherein the depositing of the second conductive material overfills the void space.

14. The method of claim 13 wherein the depositing of the first conductive material overfills the trench at the another longitudinal portion.

15. The method of claim 11 wherein the trench is provided within substrate material, the uppermost surface of the second conductive material in the longitudinal end portion being planar and within 100 nanometers of an uppermost planar surface of said substrate material after the removing.

16. A method of forming an electrically conductive line, comprising:
    providing a longitudinally elongated trench within substrate material, the trench being laterally wider at a first longitudinal location in comparison to a second longitudinal location;
    depositing a first conductive material within the trench to overfill the trench at the second location and to line and to less than fill the trench at the first location, the first conductive material being received over the substrate material laterally outward of the trench;
    depositing a second conductive material over the first and second locations of the trench in electrical connection with the first conductive material, the first and second conductive materials being of different composition relative one another, the second conductive material being received within the trench at the first longitudinal location and not within the trench at the second location, the second conductive material being received over the first conductive material laterally outward of the trench;
    removing outermost portions of the first and second conductive materials back to the substrate material; and
    etching the first conductive material selectively relative to the substrate material and selectively relative to the second conductive material to elevationally recess the first conductive material within the trench at the first and second locations.

17. The method of claim 16 wherein an uppermost surface of the second conductive material at the first location is planar and within about 10 nanometers of an uppermost planar surface of said substrate material after said removing.

18. The method of claim 17 wherein, after said etching, an uppermost surface of the second conductive material at the first location is planar and within about 10 nanometers of an uppermost planar surface of said substrate material.

19. The method of claim 17 wherein the trench comprises a gate dielectric lining and the electrically conductive line is formed to comprise a line of gates of recessed access transistors to which electrical contact is made by a conductive via received over the electrically conductive line at the first location.

20. The method of claim 16 wherein the trench comprises a gate dielectric lining and the electrically conductive line is formed to comprise a line of gates of recessed access transistors.

* * * * *